(12) United States Patent
Ashino

(10) Patent No.: US 12,165,938 B2
(45) Date of Patent: Dec. 10, 2024

(54) SEMICONDUCTOR PACKAGE, RESIN MOLDED PRODUCT, AND METHOD OF MOLDING RESIN MOLDED PRODUCT

(71) Applicant: FUJI ELECTRIC CO., LTD., Kawasaki (JP)

(72) Inventor: Kimihiro Ashino, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 405 days.

(21) Appl. No.: 17/538,480

(22) Filed: Nov. 30, 2021

(65) Prior Publication Data

US 2022/0208622 A1 Jun. 30, 2022

(30) Foreign Application Priority Data

Dec. 28, 2020 (JP) .................................. 2020-219109

(51) Int. Cl.
*H01L 23/04* (2006.01)
*B29C 45/00* (2006.01)
(Continued)

(52) U.S. Cl.
CPC .......... *H01L 23/04* (2013.01); *B29C 45/0053* (2013.01); *B29C 45/14* (2013.01);
(Continued)

(58) Field of Classification Search
CPC ....... H01L 23/04; H01L 23/49; H01L 23/045; H01L 24/48; H01L 2224/48249; H01L 2924/00014; H01L 2924/15159; H01L 2224/48091; H01L 21/4889; H01L 21/56; H01L 23/3121; B29C 45/0053; B29C 45/14; B29C 45/37; B29C 45/14639;
(Continued)

(56) References Cited

U.S. PATENT DOCUMENTS 10,651,609 B2 * 5/2020 Ueno ..................... G01L 19/143
10,852,318 B2 * 12/2020 Ueno ....................... G01F 5/005
(Continued)

FOREIGN PATENT DOCUMENTS

JP 2018-136277 A 8/2018

*Primary Examiner* — Freddie Kirkland, III
(74) *Attorney, Agent, or Firm* — Rabin & Berdo, P.C.

(57) ABSTRACT

A semiconductor package includes a flat plate-shaped terminal integrally formed with a housing portion for a semiconductor chip and a rod-shaped terminal pin that penetrates through a through-hole of the plate-shaped terminal. On a surface of the plate-shaped terminal, a resin guide portion for guiding the terminal pin to the through-hole of the plate-shaped terminal is provided. The resin guide portion is a portion of the housing portion and has a through-hole that is continuous with the through-hole of the plate-shaped terminal. During assembly of the semiconductor package, the terminal pin is inserted into the through-hole of the plate-shaped terminal, via the through-hole of the resin guide portion. A sidewall of the through-hole of the resin guide portion and a sidewall of the through-hole of the plate-shaped terminal have a same slope and form a single continuous surface; a border between the through-hole of the resin guide portion and the through-hole of the plate-shaped terminal is free of any step.

6 Claims, 19 Drawing Sheets

(51) Int. Cl.
  *B29C 45/14* (2006.01)
  *B29C 45/37* (2006.01)
  *B29L 31/34* (2006.01)
  *G01L 19/00* (2006.01)
  *H01L 23/49* (2006.01)

(52) U.S. Cl.
  CPC ........... *B29C 45/37* (2013.01); *B29L 2031/34* (2013.01); *G01L 19/0084* (2013.01); *H01L 23/49* (2013.01)

(58) Field of Classification Search
  CPC ............. B29L 2031/34; G01L 19/0084; G01L 19/0061; G01L 19/147
  See application file for complete search history.

(56) References Cited

U.S. PATENT DOCUMENTS

| | | | |
|---|---|---|---|
| 11,835,415 B2 * | 12/2023 | Ashino | ................. G01L 9/0051 |
| 2018/0238928 A1 | 8/2018 | Ueno | |
| 2022/0260444 A1 * | 8/2022 | Ashino | ................. G01L 9/0051 |

\* cited by examiner

SEMICONDUCTOR PACKAGE, RESIN MOLDED PRODUCT, AND METHOD OF MOLDING RESIN MOLDED PRODUCT

CROSS REFERENCE TO RELATED APPLICATIONS

This application is based upon and claims the benefit of priority of the prior Japanese Patent Application No. 2020-219109, filed on Dec. 28, 2020, the entire contents of which are incorporated herein by reference.

BACKGROUND OF THE INVENTION

1. Field of the Invention

Embodiments of the invention relate to a semiconductor package, a resin molded product, and a method of molding a resin molded product.

2. Description of the Related Art

A conventional sensor device proposed as a semiconductor package has a configuration including metal wiring that leads out an output signal of a semiconductor chip to an external destination, by a flat plate-shaped terminal integrally formed with a resin molded product that constitutes a housing portion (housing unit) for a semiconductor chip and by a round rod-shaped (cylinder-shaped) terminal pin that electrically connects the plate-shaped terminal and a surface electrode of the semiconductor chip, the plate-shaped terminal having a first end that is externally exposed (for example, refer to Japanese Laid-Open Patent Publication No. 2018-136277). In Japanese Laid-Open Patent Publication No. 2018-136277, a first end of the terminal pin is inserted in a through-hole formed at a second end of the plate-shaped terminal and is laser soldered to the plate-shaped terminal. A second end of the terminal pin is wire bonded to the surface electrode of the semiconductor chip.

FIG. 20 is a cross-sectional view of a state of a conventional semiconductor package during manufacture (assembly). FIG. 20 shows a vicinity of a through-hole 102 in a plate-shaped terminal 101 configuring metal wiring of a conventional semiconductor package 110. The conventional semiconductor package 110 shown in FIG. 20 includes the flat plate-shaped terminal 101 integrally formed with a housing portion of a semiconductor chip (not depicted). The plate-shaped terminal 101 has the through-hole 102 through which a round rod-shaped terminal pin 121 penetrates. A width (diameter) d101 of the through-hole 102 of the plate-shaped terminal 101 is substantially uniform between both surfaces 101a, 101b of the plate-shaped terminal 101 and is wider than a diameter d121 of the terminal pin 121.

The terminal pin 121 is inserted in the through-hole 102 of the plate-shaped terminal 101 and at one surface (hereinafter, first surface) 101a of the plate-shaped terminal 101, a resin guide portion 111 for guiding the terminal pin 121 to the through-hole 102 of the plate-shaped terminal 101 is provided. The resin guide portion 111 is a portion of the housing portion for the semiconductor chip. The resin guide portion 111 has a through-hole 112 that is continuous with the through-hole 102 of the plate-shaped terminal 101 and has a same central axis as the through-hole 102. The through-hole 112 of the resin guide portion 111 has a widest width (diameter) d111 at an insertion side (side facing away from the plate-shaped terminal 101) of the terminal pin 121, whereby insertion of the terminal pin 121 is facilitated.

Further, the width (diameter) of the through-hole 112 of the resin guide portion 111 decreases gradually with increasing proximity to the plate-shaped terminal 101, forming a tapered shape (circular truncated cone shape) such that a smallest width d112 is at a border between the resin guide portion 111 and the plate-shaped terminal 101. The terminal pin 121 is inserted in the through-hole 102 of the plate-shaped terminal 101 via the through-hole 112 of the resin guide portion 111. At this time, the terminal pin 121 contacts a tapered sidewall of the through-hole 112 of the resin guide portion 111, the terminal pin 121 is guided along the sidewall of the through-hole 112 of the resin guide portion 111, toward the plate-shaped terminal 101, and is inserted in the through-hole 102 of the plate-shaped terminal 101 and guided along a sidewall of the through-hole 102 of the plate-shaped terminal 101.

An end of the terminal pin 121 is exposed at another surface (hereinafter, second surface) 101b of the plate-shaped terminal 101 or the end protrudes from the second surface 101b of the plate-shaped terminal 101 so as to penetrate through the through-hole 102 of the plate-shaped terminal 101. The terminal pin 121 penetrates through the through-hole 102 of the plate-shaped terminal 101, is melted by laser irradiation from the second surface 101b of the plate-shaped terminal 101 to be welded to the plate-shaped terminal 101. In FIG. 20, the terminal pin 121 during insertion into the through-hole 112 of the resin guide portion 111 is indicated by solid lines and reference character 121a, while a state in which the terminal pin 121 penetrates through the through-hole 102 of the plate-shaped terminal 101 is indicated by a dashed line and reference character 121b.

SUMMARY OF THE INVENTION

According to an embodiment of the present invention, a resin molded product includes: a flat plate-shaped terminal having a first surface and a second surface that are flat and opposite to each other, the flat plate-shaped terminal having a first through-hole passing therethrough a rod-shaped terminal pin, the first through-hole penetrating through the plate-shaped terminal, between the first surface and the second surface; and a guide portion containing a resin material, the guide portion having a first side and a second side opposite to each other and being integrally formed with the flat plate-shaped terminal on the first surface of the plate-shaped terminal so that the second side of the guide portion is contacting the first surface of the flat plate-shaped terminal, the guide portion having a second through-hole having a common central axis with the first through-hole, the second through-hole penetrating through the guide portion and forming a single continuous hole with the first through-hole. The continuous hole has a first open end and a second open end opposite to each other, the first open end being an open end of the first through-hole located at the second surface of the flat plate-shaped terminal and the second open end being an open end of the second through-hole located at the first side of the guide portion, the continuous hole having a width that gradually decreases along a direction from the second open end to the first open end, whereby the hole has a tapered shape, and a sidewall of the second through-hole and a sidewall of the first through-hole have a same angle with respect to the common central axis, thereby to form a single continuous surface.

Objects, features, and advantages of the present invention are specifically set forth in or will become apparent from the

DETAILED DESCRIPTION OF THE INVENTION

Figure 1:
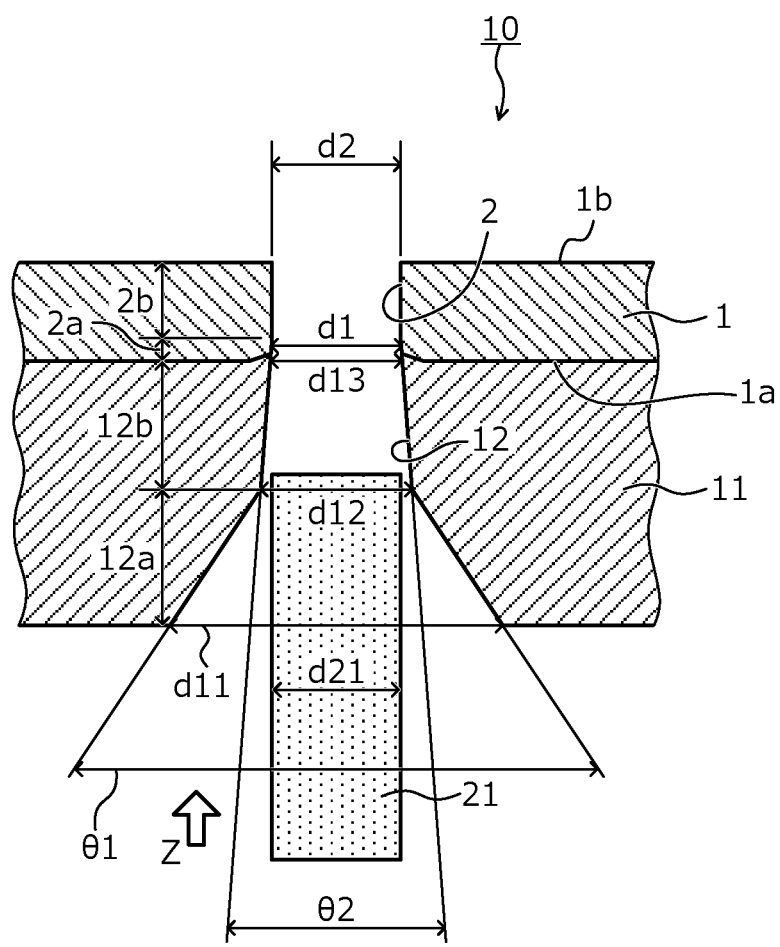
FIG. 1 is a cross-sectional view depicting a state of a semiconductor package according to an embodiment during manufacture (during assembly).

First, problems associated with the conventional techniques are discussed. In Japanese Laid-Open Patent Publication No. 2018-136277 described above and in the conventional structure depicted in FIG. 20, a step 113 is formed between the sidewall of the through-hole 112 of the resin guide portion 111 and the sidewall of the through-hole 102 of the plate-shaped terminal 101. A mold (not depicted) for molding resin for the housing portion has a portion that forms the through-hole 112 of the resin guide portion 111 and this portion has a width (diameter) that is wider than the width (diameter) d101 of the through-hole 102 of the plate-shaped terminal 101 to prevent misalignment of the plate-shaped terminal 101 when the plate-shaped terminal 101 is integrally formed with the housing portion; and in a state with a periphery 101c of the through-hole 102 of the plate-shaped terminal 101 supported by the mold, resin flows into the mold, whereby the step 113 is formed.

The step 113 is a corner portion formed by the sidewall of the through-hole 102 of the plate-shaped terminal 101 and the first surface 101a facing the resin guide portion 111, and is exposed in the through-hole 112 of the resin guide portion 111. Therefore, when the terminal pin 121 is guided along the sidewall of the through-hole 112 of the resin guide portion 111, toward the plate-shaped terminal 101, and reaches the step 113, metal members (the terminal pin 121 and the plate-shaped terminal 101) contact each other. A material of the terminal pin 121 is softer than a material of the plate-shaped terminal 101 and therefore, an end corner portion 121c of the terminal pin 121 may become caught on the step 113 and shaved off, and these metal shavings may cause short-circuit defects.

Embodiments of a semiconductor package, a resin molded product, and a method of molding a resin molded product according to the present invention is described in detail with reference to the accompanying drawings. In the description of the embodiments below and the accompanying drawings, main portions that are identical are given the same reference numerals and will not be repeatedly described.

Figure 2:
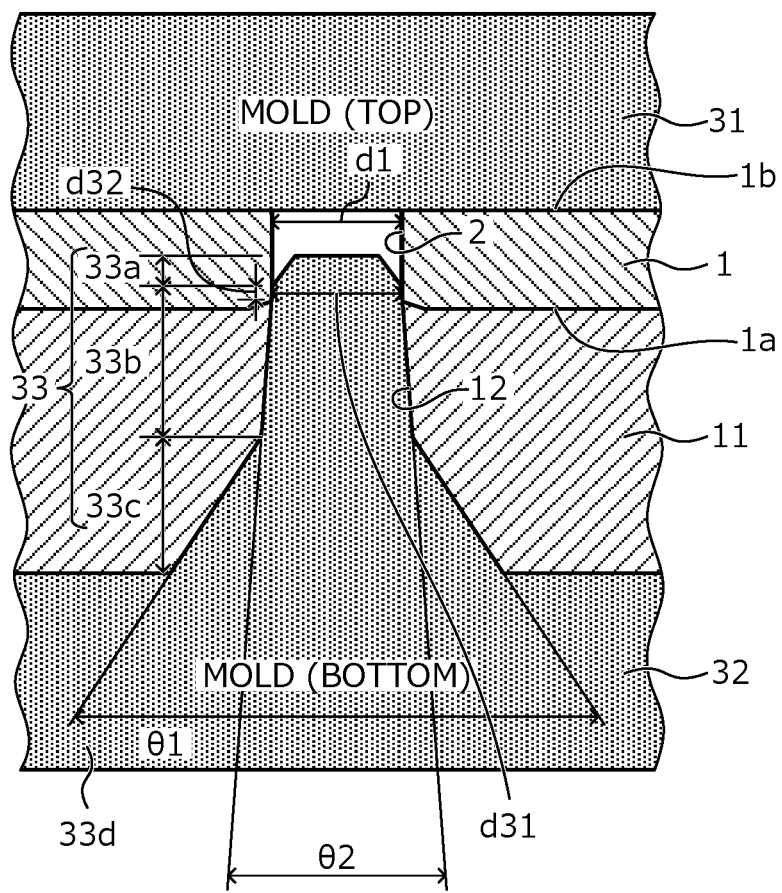
FIG. 2 is a cross-sectional view depicting a state of the semiconductor package according to the embodiment during manufacture (during resin molding).
Figure 3:
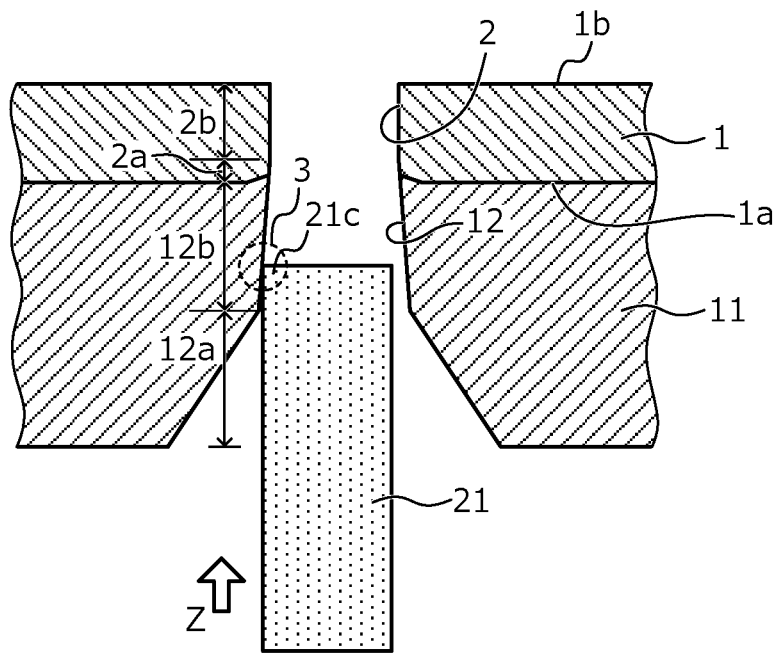
FIG. 3 is a cross-sectional view depicting a state of the semiconductor package according to the embodiment during manufacture (during assembly).
Figure 4:
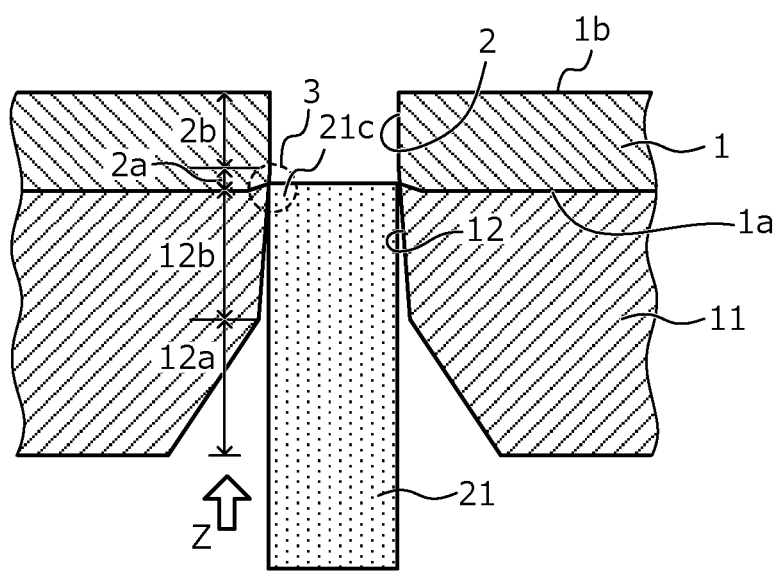
FIG. 4 is a cross-sectional view depicting a state of the semiconductor package according to the embodiment during manufacture (during assembly).

FIGS. 1, 3, and 4 are cross-sectional views depicting states of a semiconductor package according to an embodiment during manufacture (during assembly). FIG. 2 is a cross-sectional view depicting a state of the semiconductor package according to the embodiment during manufacture (during resin molding). A semiconductor package 10 according to the embodiment depicted in FIG. 1 includes a flat plate-shaped terminal 1 (for example, corresponds to later-described connector pins 81 in FIG. 5) integrally formed (insert molded) with a housing portion (for example, corresponds to a later-described inner housing portion 53 in FIG. 5: resin molded product) for a semiconductor chip (for example, corresponds to a later-described pressure sensor chip 61 in FIG. 5) and a terminal pin 21 (for example, corresponds to a later-described lead pin 65 in FIG. 5) that has a round rod-shape and penetrates through a through-hole (first through-hole) 2 of the plate-shaped terminal 1.

The plate-shaped terminal 1 is metal wiring that leads out an output signal of the semiconductor chip to an external destination. The plate-shaped terminal 1 is a metal member that contains, for example, phosphorus (P) and copper (Cu) and has a portion having flat surfaces 1a, 1b and in which at least a later-described through-hole 2 is formed. The surfaces of the plate-shaped terminal 1 may be, for example, tin (Sn) plated. The plate-shaped terminal 1 has the through-hole 2 that penetrates through the plate-shaped terminal 1, between the surfaces 1a, 1b. The terminal pin 21 (corresponds to later-described first lead pins 65a in FIG. 5) is inserted into and penetrates through the through-hole 2 of the plate-shaped terminal 1, via a through-hole (second through-hole) 12 of a resin guide portion 11 during assembly of the semiconductor package 10. Reference character Z indicates an insertion direction of the terminal pin 21. FIGS. 1 to 4 depict an enlarged view of a vicinity of the through-hole 2 of the plate-shaped terminal 1.

The through-hole 2 of the plate-shaped terminal 1 has a width (diameter) d1 at a first portion 2a of an insertion side (side facing the later-described resin guide portion 11) from which the terminal pin 21 is inserted and the width d1 is wider at than a width at a second portion (portion excluding the first portion 2a) 2b. The first portion 2a of the through-hole 2 of the plate-shaped terminal 1 is a pressure welding mark generated by a protruding portion 33 of a later-described lower mold 32 (refer to FIG. 2) being pressed thereagainst. The first portion 2a of the through-hole 2 of the plate-shaped terminal 1 has a slope that is a same as a slope of a side surface of the protruding portion 33 of the lower mold 32, and has a substantially tapered shape (circular truncated cone shape) with a width that progressively decreases from the terminal pin 21 insertion side of the through-hole 2.

The second portion 2b of the through-hole 2 of the plate-shaped terminal 1 is apart from an insertion opening for the terminal pin 21 and has a width (diameter) d2 that is substantially uniform, the width d2 being substantially a same as a diameter d21 of the terminal pin 21 or a dimension slightly larger than the diameter d21 of the terminal pin 21. Widths that are substantially the same means that the widths are the same within a range that includes allowable error due to process variation. The terminal pin 21 that penetrates through the through-hole 2 of the plate-shaped terminal 1 is in contact with the second portion 2b of the through-hole 2 of the plate-shaped terminal 1. The width d2 of the second portion 2b of the through-hole 2 of the plate-shaped terminal 1 may be a smallest width possible enabling insertion of the terminal pin 21.

The terminal pin 21 electrically connects the plate-shaped terminal 1 and an electrode of the semiconductor chip. The terminal pin 21 is a metal member containing, for example, an iron (Fe) and nickel (Ni) alloy. A surface of the terminal pin 21 may be nickel plated. On one surface (first surface) 1a of the plate-shaped terminal 1, the resin guide portion 11 for guiding the terminal pin 21 to the through-hole 2 of the plate-shaped terminal 1 is provided. The resin guide portion 11 is a portion of the housing portion (housing unit) that houses the semiconductor chip, and is adhered to the first surface 1a of the plate-shaped terminal 1 integrally formed during resin molding of the housing portion. The resin guide portion 11 has a through-hole 12 that is continuous with the through-hole 2 of the plate-shaped terminal 1 and has a central axis that is a same as a central axis of the through-hole 2.

The resin guide portion 11 has a first side and a second side opposite to each other. The through-hole 12 of the resin guide portion 11 is formed from the first side to the second side of the resin guide portion 11, and the through-hole 12 has a widest width (diameter) d11 at the terminal pin 21 insertion side (second side, side apart from the plate-shaped terminal 1), whereby insertion of the terminal pin 21 is facilitated. The first side of the resin guide portion 11 contacts the first surface 1a of the plate-shape terminal 1. Further, a sidewall of the through-hole 12 of the resin guide portion 11 has an angle of inclination with respect to a sidewall (substantially perpendicular with respect to the surfaces 1a, 1b of the plate-shaped terminal 1) of the second portion 2b of the through-hole 2 of the plate-shaped terminal 1, the angle of inclination being greater at a first portion 12a of the terminal pin 21 insertion side than at a second portion 12b of a side facing the plate-shaped terminal 1. In particular, the first portion 12a of the through-hole 12 of the resin guide portion 11 is a portion from an insertion opening for the terminal pin 21 to a predetermined thickness of the resin guide portion 11, and has a tapered shape (circular truncated cone shape) with a width that progressively decreases with increasing proximity to the plate-shaped terminal 1, from the insertion opening for the terminal pin 21.

The second portion 12b of the through-hole 12 of the resin guide portion 11 is a portion from a position (border between the first and the second portions 12a, 12b) of the predetermined thickness of the resin guide portion 11 to a border between the resin guide portion 11 and the plate-shaped terminal 1 (portion of a remaining thickness of the resin guide portion 11). The second portion 12b of the through-hole 12 of the resin guide portion 11 has a tapered shape with a width that decreases with increasing proximity to the plate-shaped terminal 1, from the border between the first and the second portions 12a, 12b of the through-hole 12 of the resin guide portion 11. The sidewall of the second portion 12b of the through-hole 12 of the resin guide portion 11 has a slope that is a same as a slope of a sidewall of the first portion 2a of the through-hole 2 of the plate-shaped terminal 1 and is continuous with the sidewall of the first portion 2a of the through-hole 2 of the plate-shaped terminal 1.

A width d13 of the through-hole 12 of the resin guide portion 11 at the border between the resin guide portion 11 and the plate-shaped terminal 1 is equal to the width d1 of the first portion 2a of the through-hole 2 of the plate-shaped terminal 1, and the first surface 1a of the plate-shaped terminal 1 is not exposed by the through-hole 12 of the resin guide portion 11. Therefore, the step 113 (refer to FIG. 20) such as that of the conventional structure is not present at a border between the through-hole 12 of the resin guide portion 11 and the through-hole 2 of the plate-shaped terminal 1. Widths of the through-hole 12 of the resin guide portion 11 (the width d11 of the insertion opening for the terminal pin 21, a width d12 at the border between the first and the second portions 12a, 12b, the width d13 at the border between the resin guide portion 11 and the plate-shaped terminal 1) are wider than the width d2 of the second portion 2b of the through-hole 2 of the plate-shaped terminal 1.

An angle (slope) θ2 of the sidewall of the second portion 12b of the through-hole 12 of the resin guide portion 11 is smaller than an angle (slope) θ1 of the sidewall of the first portion 12a of the through-hole 12 of the resin guide portion 11 and may be, for example, at most about 30 degrees. The angle θ1 of the sidewall of the first portion 12a of the through-hole 12 of the resin guide portion 11 is an angle (cone apex angle) formed with an extension line of an edge line of the sidewall of the first portion 12a of the through-hole 12 of the resin guide portion 11 (sidewall of circular truncated cone). The angle θ2 of the sidewall of the second portion 12b of the through-hole 12 of the resin guide portion 11 is an angle formed with an extension line of an edge line of the sidewall of the second portion 12b of the through-hole 12 of the resin guide portion 11.

The angle θ2 of the sidewall of the second portion 12b of the through-hole 12 of the resin guide portion 11 may be 0 degrees (i.e., perpendicular to the surfaces 1a, 1b of the plate-shaped terminal 1). In this instance, the second portion 12b of the through-hole 12 of the resin guide portion 11 and the first portion 2a of the through-hole 2 of the plate-shaped terminal 1 have a cylindrical shape with a substantially uniform width in the insertion direction Z of the terminal pin 21. Even when a corner portion protruding in the through-hole 12 is formed due to a difference of the angles θ1, θ2 of these sidewalls at the border between the first and the second portions 12a, 12b of the through-hole 12 of the resin guide portion 11, the terminal pin 21 is harder than the resin guide portion 11 and therefore, an end corner portion 21c of the terminal pin 21 is not shaved off by the corner portion of resin.

Further, even when the angle θ2 of the sidewall of the second portion 12b of the through-hole 12 of the resin guide portion 11 is 0 degrees, the first portion 12a of the through-hole 12 of the resin guide portion 11 has a tapered shape with a width that gradually decreases with increasing proximity to the plate-shaped terminal 1, from the insertion opening for the terminal pin 21, whereby insertion of the terminal pin 21 into the through-hole 12 of the resin guide portion 11 may be facilitated. The sidewall of the first portion 2a of the through-hole 2 of the plate-shaped terminal 1 is continuous with the sidewall of the second portion 12b of the through-hole 12 of the resin guide portion 11 and has an angle of 0 degrees, whereby a step like that of the conventional structure is not present at the border between the through-hole 12 of the resin guide portion 11 and the through-hole 2 of the plate-shaped terminal 1.

Further, a reason that the angle θ2 of the sidewall of the second portion 12b of the through-hole 12 of the resin guide portion 11 may be set to be at most the upper limit described above is as follows. As depicted in FIG. 2, the housing portion of the semiconductor package 10 is resin molded by supporting and fixing the plate-shaped terminal 1 at a predetermined position between molds (first and second molds) 31, 32 by the molds 31, 32, and pouring resin in a space formed between the molds 31, 32, followed by cooling to solidify the resin. In FIG. 2, while only a shape of the molds 31, 32 close to the through-hole 2 of the plate-shaped terminal 1 is depicted, a contour of the space formed between the molds 31, 32 is a same as a contour of an entire area of the predetermined housing portion (refer to FIG. 7, FIG. 8A, FIG. 8B).

Of the two molds 31, 32, one mold (hereinafter, upper mold) 31 is in contact with a portion of another surface (second surface) 1b of the plate-shaped terminal 1 and supports the plate-shaped terminal 1. The portion of the second surface 1b of the plate-shaped terminal 1 in contact with the upper mold 31 is a portion where the plate-shaped terminal 1 is exposed when the housing portion is completed. The other mold (hereinafter, lower mold) 32 has the protruding portion 33 that has a contour that is a same as a contour of the through-hole 2 of the plate-shaped terminal 1 and that protrudes in a protrusion-like shape toward the plate-shaped terminal 1 (upward). The protruding portion 33 of the lower mold 32 has an upper end that is inserted in the through-hole 2 of the plate-shaped terminal 1 from the first surface 1a of the plate-shaped terminal 1, and is pressed in an open end of the through-hole 2 of the plate-shaped terminal 1. The protruding portion 33 of the lower mold 32 is in contact with the sidewall of the first portion 2a of the through-hole 2 of the plate-shaped terminal 1 and supports the plate-shaped terminal 1.

The protruding portion 33 of the lower mold 32 is configured by a first portion 33a that is an apex portion where a corner portion is chamfered, and second and third portions 33b, 33c respectively forming the second and the first portions 12b, 12a of the through-hole 12 of the resin guide portion 11. The first portion 33a of the protruding portion 33 of the lower mold 32 has corner portions that are chamfered to facilitate insertion in the through-hole 2 of the plate-shaped terminal 1. The third portion 33c of the protruding portion 33 of the lower mold 32 is a portion continuous with a base 33d of the lower mold 32 and has a tapered shape that is a same as the tapered shape of the first portion 12a of the through-hole 12 of the resin guide portion 11. In other words, the third portion 33c of the protruding portion 33 of the lower mold 32 has a side surface of a same angle as the angle θ1 of the first portion 12a of the through-hole 12 of the resin guide portion 11.

The second portion 33b of the protruding portion 33 of the lower mold 32 is a portion between the first and the second portions 33a, 33c of the protruding portion 33 of the lower mold 32, and has a tapered shape that is a same as the tapered shape of the second portion 12b of the through-hole 12 of the resin guide portion 11. In other words, the second portion 33b of the protruding portion 33 of the lower mold 32 has a side surface of a same angle as the angle θ2 of the second portion 12b of the through-hole 12 of the resin guide portion 11. From the first portion 33a of the protruding portion 33 of the lower mold 32 to an upper portion (portion near a border with the first portion 33a) of the second portion 33b is inserted in the through-hole 2 of the plate-shaped terminal 1. The upper portion of the second portion 33b of the protruding portion 33 of the lower mold 32 is pressure welded to the sidewall of the plate-shaped terminal 1 in the through-hole 2, at the open end of the through-hole 2 of the plate-shaped terminal 1. In the pressure welded portion, the sidewall of the first portion 2a of the through-hole 2 of the plate-shaped terminal 1 is inclined by the angle θ2 that is the angle θ2 at which a side surface of the second portion 33b of the protruding portion 33 of the lower mold 32 is inclined.

The width d1 of the first portion 2a of the through-hole 2 of the plate-shaped terminal 1 to which the protruding portion 33 of the lower mold 32 is pressure welded is wider than the width d2 of the second portion 2b of the through-hole 2 of the plate-shaped terminal 1. The contour of the space formed between the upper mold 31 and the lower mold 32 is optimized by pre-calculating a contact allowance d32 for the protruding portion 33 of the lower mold 32. The contact allowance d32 for the protruding portion 33 of the lower mold 32 is a width of a portion of the second portion 33b of the protruding portion 33 of the lower mold 32 in contact with the through-hole 2 of the plate-shaped terminal 1, and is a thickness of the first portion 2a of the through-hole 2 of the plate-shaped terminal 1. In this manner, with the plate-shaped terminal 1 in a fixed state, the upper mold 31 and the lower mold 32 are brought together, whereby the space having a contour that is a same as a contour of the housing portion is formed between the upper mold 31 and the lower mold 32, and the space having a contour that is a same as a contour of the resin guide portion 11 is formed between the first surface 1a of the plate-shaped terminal 1 and the lower mold 32 (first process). Resin is poured into and fills the space between the molds 31, 32 and is then solidified, whereby the plate-shaped terminal 1 is integrally formed in the housing portion (includes the resin guide portion 11) (second process).

The contact allowance d32 for the protruding portion 33 of the lower mold 32 is a length of a contact portion (pressure welded portion of the sidewall of the through-hole 2 of the plate-shaped terminal 1 by the protruding portion 33 of the lower mold 32) between the side surface of the protruding portion 33 of the lower mold 32 and the sidewall of the through-hole 2 of the plate-shaped terminal 1, in a vertical direction (insertion direction of the protruding portion 33 of the lower mold 32) when the protruding portion 33 of the lower mold 32 is inserted in the through-hole 2 of the plate-shaped terminal 1. The second portion 33b of the protruding portion 33 of the lower mold 32 is pressure welded to the sidewall of the first portion 2a of the through-hole 2 of the plate-shaped terminal 1, whereby the sidewall of the first portion 2a of the through-hole 2 of the plate-shaped terminal 1 and the sidewall of the second portion 12b of the through-hole 12 of the resin guide portion 11 have a same slope and become a single continuous surface.

The greater is the angle θ2 of the sidewall of the second portion 12b of the through-hole 12 of the resin guide portion 11, the smaller is a width d31 of the upper portion of the second portion 33b of the protruding portion 33 of the lower mold 32 and therefore, the greater is a deformation amount of the first portion 12a of the through-hole 12 of the plate-shaped terminal 1, the first portion 12a of the through-hole 12 of the plate-shaped terminal 1 being deformed by pressure welding by the protruding portion 33 of the lower mold 32. The deformed portion of the first portion 12a of the through-hole 12 of the plate-shaped terminal 1 moves toward the second portion 2b and therefore, the greater is the deformation amount, the narrower is the width d2 of the second portion 2b of the through-hole 2 of the plate-shaped terminal 1. Accordingly, as described above, the angle θ2 of the sidewall of the second portion 12b of the through-hole 12 of the resin guide portion 11 may be, preferably, at most about 30 degrees.

During assembly of the semiconductor package 10, the terminal pin 21 is inserted in the through-hole 12 of the resin guide portion 11, contacts the tapered sidewall of the second portion 12b of the through-hole 12 (refer to FIG. 3), and is guided along the sidewall of the second portion 12b of the through-hole 12, toward the plate-shaped terminal 1 (refer to FIG. 4). In FIGS. 3 and 4, a contact area 3 between the end corner portion 21c of the terminal pin 21 and the respective sidewalls of the through-holes 12, 2 is surrounded by a dashed line circle. As described above, no step is present at the border between the through-hole 12 of the resin guide portion 11 and the through-hole 2 of the plate-shaped terminal 1 and therefore, the terminal pin 21 may be moved from the through-hole 12 of the resin guide portion 11, to the through-hole 2 of the plate-shaped terminal 1, without the end corner portion 21c of the terminal pin 21 getting caught on the plate-shaped terminal 1 at the border between the through-hole 12 of the resin guide portion 11 and the through-hole 2 of the plate-shaped terminal 1.

The terminal pin 21 is inserted penetrating through the through-hole 2 of the plate-shaped terminal 1, and is inserted until the end is exposed at the second surface 1b of the plate-shaped terminal 1 or protrudes from the second surface 1b of the plate-shaped terminal 1. As a result, the terminal pin 21 and a sidewall of the second portion 2b of the plate-shaped terminal 1 contact each other or a small gap occurs between the terminal pin 21 and the sidewall of the second portion 2b of the plate-shaped terminal 1. The terminal pin 21 penetrates through the through-hole 2 of the plate-shaped terminal 1 and in this state is melted by laser irradiation from the second surface 1b of the plate-shaped terminal 1 and welded to the plate-shaped terminal 1. A side surface of the terminal pin 21 and the sidewall of the second portion 2b of the plate-shaped terminal 1 may be welded to each other by performing the laser irradiation along the through-hole 2 of the plate-shaped terminal 1.

Figure 5:
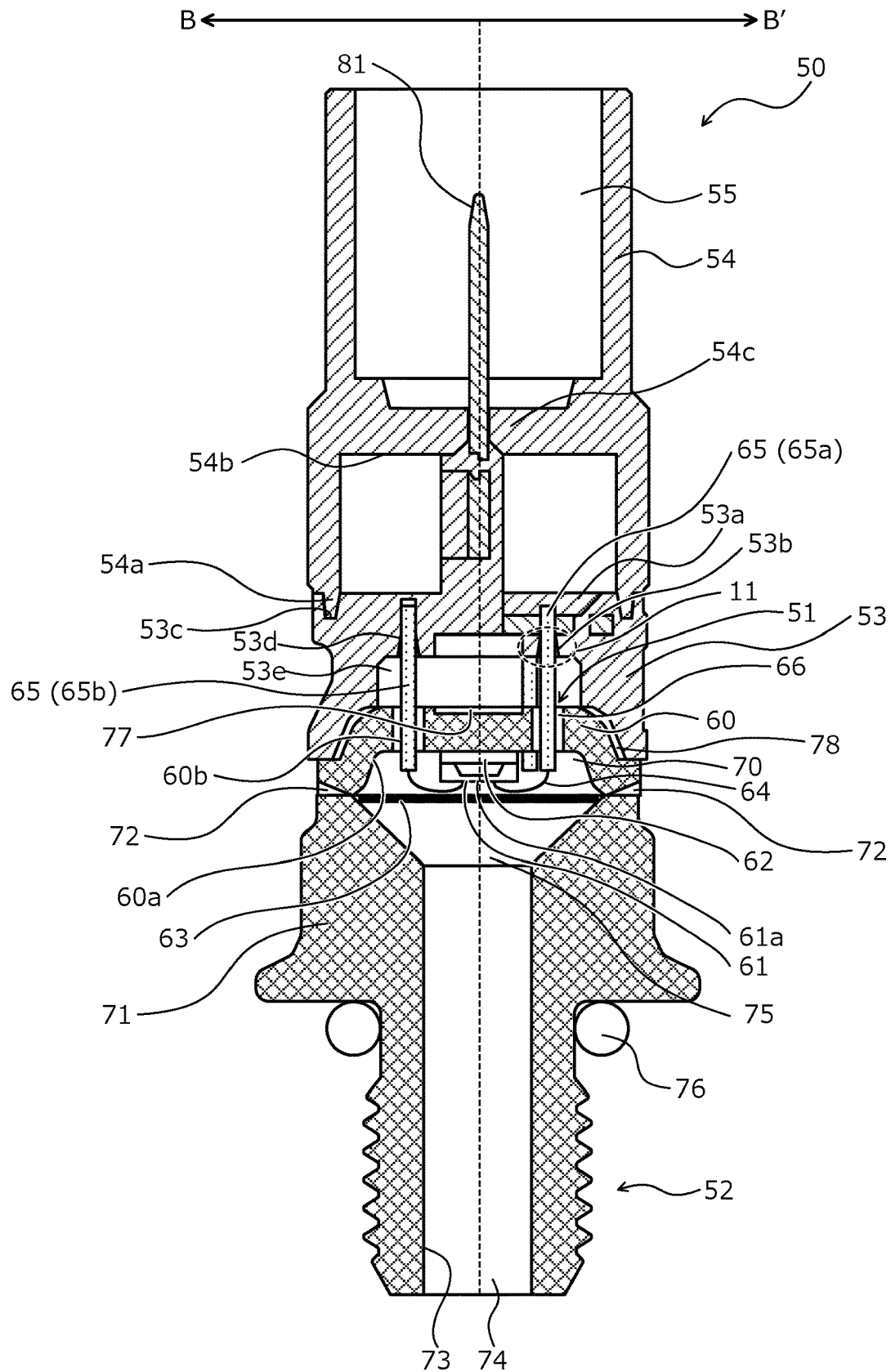
FIG. 5 is a cross-sectional view depicting a configuration of a physical quantity sensor device to which the semiconductor package according to the embodiment is applied.

Configuration of a physical quantity sensor device to which the semiconductor package 10 according to the embodiment is applied is described taking a pressure sensor device as an example. FIG. 5 is a cross-sectional view depicting the configuration of the physical quantity sensor device to which the semiconductor package according to the embodiment is applied. A physical quantity sensor device 50 depicted in FIG. 5 includes a sensor element 51, a screw portion 52, the inner housing portion 53, and a socket housing portion (connector housing portion) 54. In the present embodiment, a socket portion that is an interface for transmitting signals of the sensor element to an external destination is assumed to be configured separating the inner housing portion 53 and the socket housing portion 54.

The sensor element 51 includes a storage box 60, a pressure sensor chip (semiconductor chip) 61, a base member 62, and a diaphragm 63. FIG. 5 depicts a cross-section of the structure of the semiconductor package 10, along cutting line B-B' shown in later-described FIG. 15B. The storage box 60 contains, for example, a metal such as a stainless steel material (SUS). The pressure sensor chip 61, the base member 62, and the diaphragm 63 are stored in a recess 60a of the storage box 60. The pressure sensor chip 61 has, for example, a diaphragm, four gauge resistors (not depicted), and a pad portion (not depicted).

In the pressure sensor chip 61, a pressure sensor element such as a Wheatstone bridge circuit configured by the gauge resistors described above, a control circuit, a surge protecting element, a filter, etc. is formed. The control circuit includes circuits that amplify output signals of the pressure sensor element, correct sensitivity and offset and a circuit that compensates temperature characteristics of these circuits, etc. The diaphragm of the pressure sensor chip 61 is a pressure receiving portion formed by concave processing from a first main surface (upper surface in FIG. 5) of the pressure sensor chip 61. The gauge resistors and the pad portion of the pressure sensor chip 61 are formed on a second main surface of the pressure sensor chip 61 (lower surface in FIG. 5).

The gauge resistors of the pressure sensor chip 61 convert distortion caused by the pressure received by the diaphragm, into a resistance value. Electrodes provided in the pad portion of the pressure sensor chip 61 are respectively connected to the later-described lead pins 65 by bonding wires 64. The electrodes provided in the pad portion are connected to the control circuits by wiring (not depicted) containing a metal, etc. In other words, the lead pins 65 are connected to the control circuits, via the bonding wires 64 and the electrodes provided in the pad portion. The pad portion and the control circuits are provided on the second main surface of the pressure sensor chip 61, in a portion free of the diaphragm.

The first main surface of the pressure sensor chip 61 is adhered to a bottom of the recess 60a of the storage box 60 via the base member 62. The base member 62, for example, may contain a glass material, etc. The base member 62 and the pressure sensor chip 61 are coupled to each other by electrostatic coupling. The base member 62 and the storage box 60 are adhered to each other by an adhesive (not depicted). The electrodes on the second main surface of the pressure sensor chip 61 are respectively connected to different ones of the lead pins 65 described hereinafter, by the bonding wires 64. The lead pins 65 are terminal pins for leading out signals of the sensor element 51, and all have a same length.

The lead pins 65 respectively pass through different through-holes 60b of the storage box 60, penetrate through the storage box 60, and are fixed to the storage box 60 by insulating members 66 that contain, for example, glass and cover the through-holes 60b, respectively. Ends (hereinafter, lower ends) of the lead pins 65 protrude downward (toward the screw portion 52) from the recess 60a of the storage box 60 and, by the bonding wires 64, are connected to the electrodes that are provided in the pad portion on the second main surface of the pressure sensor chip 61. Other ends (hereinafter, upper ends) of the lead pins 65 protrude upward (toward the socket housing portion 54) from a side of the storage box 60, opposite to a side thereof having the recess 60a.

In particular, of the lead pins 65, lower ends of lead pins (hereinafter, first lead pins) 65a that include a power source terminal, a ground terminal, and an output terminal are respectively connected to the electrodes of the pressure sensor element. Upper ends of the first lead pins 65a penetrate through through-holes 53b of the inner housing portion 53. Lower ends of remaining lead pins (hereinafter, second lead pins) 15b of the lead pins 65 are respectively connected to the electrodes of predetermined control circuits. The second lead pins 65b are used for trimming and adjustment of characteristics during assembly of the physical quantity sensor device 50 and are not used after the trimming and the adjustment of the characteristics.

The lead pins 65 contain, for example, 42Alloy, or an alloy such as an iron nickel alloy (50Ni—Fe) containing nickel (Ni) at about 50 wt % and iron (Fe) for a remaining portion. The side of the storage box 60, opposite to the side thereof having the recess 60a has a concave portion 77. The concave portion 77 has a function of suppressing a concentration of stress at the insulating members 66 in the through-holes 60b of the storage box 60. The screw portion 52 contains, for example, a metal such as SUS (steel special use stainless: stainless steel material).

In a center of the screw portion 52, a through-hole (inlet opening) 73 through which, for example, air that is a gas for which a pressure thereof is to be measured or oil that is a liquid for which a pressure thereof is to be measured is provided in a vertical direction (axial direction of the lead pins 65). An opening of the through-hole 73 at a first open end of the screw portion 52 is a pressure inlet opening 74. The storage box 60 is placed on a base 71 provided at a second open end of the screw portion 52, so that the recess 60a of the storage box 60 and an opening 75 of the through-hole 73 face each other, the opening 75 being at the second open end of the screw portion 52 and the diaphragm 63 intervening between the opening 75 and the storage box 60. A periphery of stacked (overlapping) portions of the storage box 60, the diaphragm 63, and the base 71 of the screw portion 52 is joined by laser welding.

The diaphragm 63 is a thin wavy metal plate containing, for example, a metal such as SUS. The diaphragm 63 is disposed so as to cover the opening of the recess 60a of the storage box 60 and the second open end of the screw portion 52. A space surrounded by the recess 60a of the storage box 60 and the diaphragm 63 is filled with a liquid (pressure medium) 70 such as a silicone oil that transmits pressure to the pressure sensor chip 61. Reference numeral 72 of the periphery of stacked portions (joined portions) of the storage box 60, the diaphragm 63, and the base 71 of the screw portion 52 represents welded portions of the storage box 60 and the base 71 of the screw portion 52. Reference number 76 represents an O-ring.

The inner housing portion 53 is a resin member integrally formed with the connector pins 81 and has a substantially recess-like shape surrounding a periphery and an upper portion of the sensor element 51. The inner housing portion 53 is adhered to an outer peripheral portion of the storage box 60 by an adhesive 78, the outer peripheral portion being on the side of the storage box 60, opposite to the side thereof having the recess 60a. The adhesive 78 intervenes in substantially an entire area of contact surfaces between the storage box 60 and the inner housing portion 53. In a recess 53e of the inner housing portion 53, grooves having a depth capable of accommodating the second lead pins 65b are provided. A shape of openings (insertion openings for the second lead pins 65b) of the grooves is similar to that of the later-described through-holes 53b.

The through-holes 53b through which the first lead pins 65a are to penetrate are provided in a portion (hereinafter, upper portion) 53a of the inner housing portion 53, the upper portion 53a covering the upper portion of the sensor element 51. The upper portion 53a of the inner housing portion 53 corresponds to the resin guide portion 11 in FIG. 1 and the through-holes 53b correspond to the through-hole 12 of the resin guide portion 11 in FIG. 1. The connector pins 81 are integrally formed with the upper portion 53a of the inner housing portion 53. The connector pins 81 correspond to the plate-shaped terminal 1 in FIG. 1 and have flat surfaces (correspond to the surfaces 1a, 1b in FIG. 1) opposite to each other, at horizontal portions 81a (refer to later-described FIGS. 6A, 6B, 6C) integrated with the upper portion 53a of the inner housing portion 53.

The connector pins 81 are signal terminals for communicating signals between the physical quantity sensor device 50 and an external destination. The horizontal portions 81a of the connector pins 81 have through-holes 81c connected to the through-holes 53b of the inner housing portion 53. The through-holes 81c of the connector pins 81 correspond to the through-hole 2 of the plate-shaped terminal 1 in FIG. 1. A configuration of the connector pins 81 is described hereinafter (refer to FIGS. 6A, 6B, 6C, 7, 8A, 8B). The connector pins 81, for example, contain a metal such as phosphor bronze (a copper (Cu) alloy containing tin (Sn)), 42Alloy, 50Ni—Fe, etc., and by laser welding, the connector pins 81 and the lead pins 65 are joined so as to melt into one another.

The socket housing portion 54 is a connecting portion for external wiring and houses the vertical portions 81b (refer to later-described FIGS. 6A, 6B, 6C) of the connector pins 81. The socket housing portion 54 has, for example, a substantially cylindrical shape surrounding a periphery of the vertical portions 81b of the connector pins 81. For example, the connector pins 81 penetrate through through-holes 54c of a bottom 54b of the socket housing portion 54 and protrude in a space 55 surrounded by the socket housing portion 54. The socket housing portion 54 is adhered to an outer peripheral portion of an upper surface of the upper portion 53a of the inner housing portion 53 by an adhesive (not depicted). The adhesive intervenes in substantially an entire area of contact surfaces between the inner housing portion 53 and the socket housing portion 54.

In the described configuration of the physical quantity sensor device 50, when the pressure medium is introduced from the pressure inlet opening 74 and pressure is received by the diaphragm of the pressure sensor chip 61, the diaphragm becomes deformed. Subsequently, resistance values of the gauge resistors on the diaphragm of the pressure sensor chip 61 change, whereby a voltage signal corresponding to the change is generated. The voltage signal is amplified by an amplifier circuit adjusted by adjustment circuits such as a sensitivity correcting circuit, an offset correcting circuit, and a temperature characteristics correcting circuit, and is output from the pressure sensor chip 61. Subsequently, the signal output from the pressure sensor chip 61 is output to an external destination via the bonding wires 64, the first lead pins 65a, and the connector pins 81.

Figure 6A:
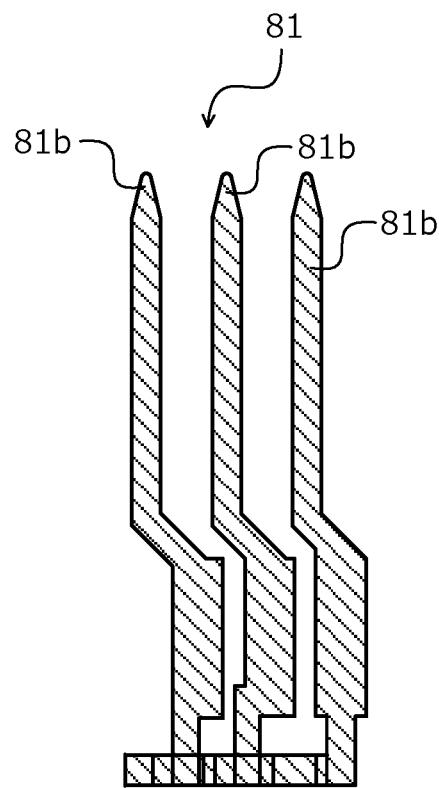
FIG. 6A is a diagram depicting a state of the physical quantity sensor device in FIG. 5 during manufacture (assembly).
Figure 6B:
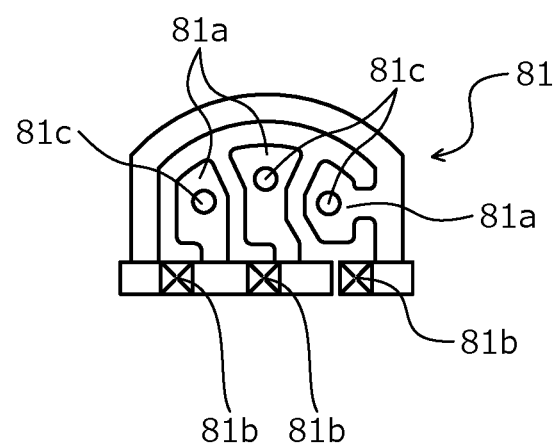
FIG. 6B is a diagram depicting a state of the physical quantity sensor device in FIG. 5 during manufacture (assembly).
Figure 6C:
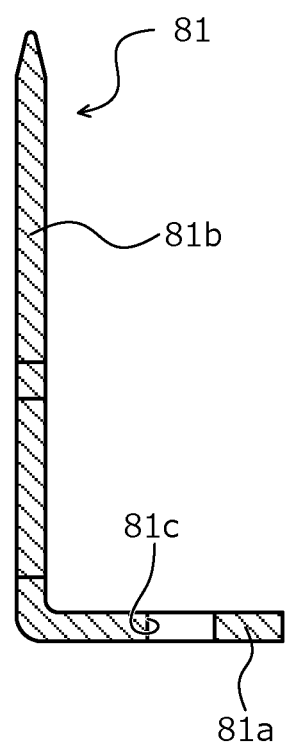
FIG. 6C is a diagram depicting a state of the physical quantity sensor device in FIG. 5 during manufacture (assembly).

Next, a method of manufacturing (method of assembling) the physical quantity sensor device 50 depicted in FIG. 5 is described. FIGS. 6A, 6B, 6C, 7, 8A, 8B, 9, 10, 11, 12, 13, 14, 15A, 15B, 16, 17, 18A, 18B, and 19 are diagrams depicting states of the physical quantity sensor device in FIG. 5 during manufacture (assembly). FIGS. 6A, 6B, 6C depict only the connector pins 81 without showing the inner housing portion 53. FIGS. 6A and 6C respectively depict states when the connector pins 81 are viewed from directions orthogonal to each other and parallel to an upper surface (corresponds to the surfaces 1a, 1b of the plate-shaped terminal 1 in FIG. 1) of the horizontal portions 81a of the connector pins 81. FIG. 6B depicts a state when the horizontal portions 81a of the connector pins 81 are viewed in a direction from the upper surfaces of the horizontal portions 81a.

First, configuration of the connector pins 81 is described with reference to FIGS. 6A to 8B. The physical quantity sensor device 50 has at least three of the connector pins 81. Of the connector pins 81, one of the connector pins 81 is a signal terminal pin that supplies power supply signals for supplying power-supply voltage and that is connected to the first lead pin 65a that is the power source terminal. Another one of the connector pins 81 is the signal terminal pin for leading out sensor signals and is connected to the first lead pin 65a that is the output terminal. Another one of the connector pins 81 is the signal terminal pin for grounding (earth) and is connected to the first lead pin 65a that is the ground terminal.

In a cross-sectional view, each of the connector pins 81 has a substantially L-shape formed by the horizontal portions 81a embedded in the upper portion 53a of the inner housing portion 53 and the vertical portions 81b connected to the horizontal portions 81a and orthogonal to the horizontal portions 81a. All of the connector pins 81 may be integrated with one another in a state of being electrically insulated from one another. During formation of the inner housing portion 53, all of the connector pins 81 are fixed at predetermined positions in a mold (corresponds to the molds 31, 32 in FIG. 2) for forming the inner housing portion 53. By pouring a resin material into the mold, the connector pins 81 are integrally formed (insert molding) with the inner housing portion 53.

Figure 7:
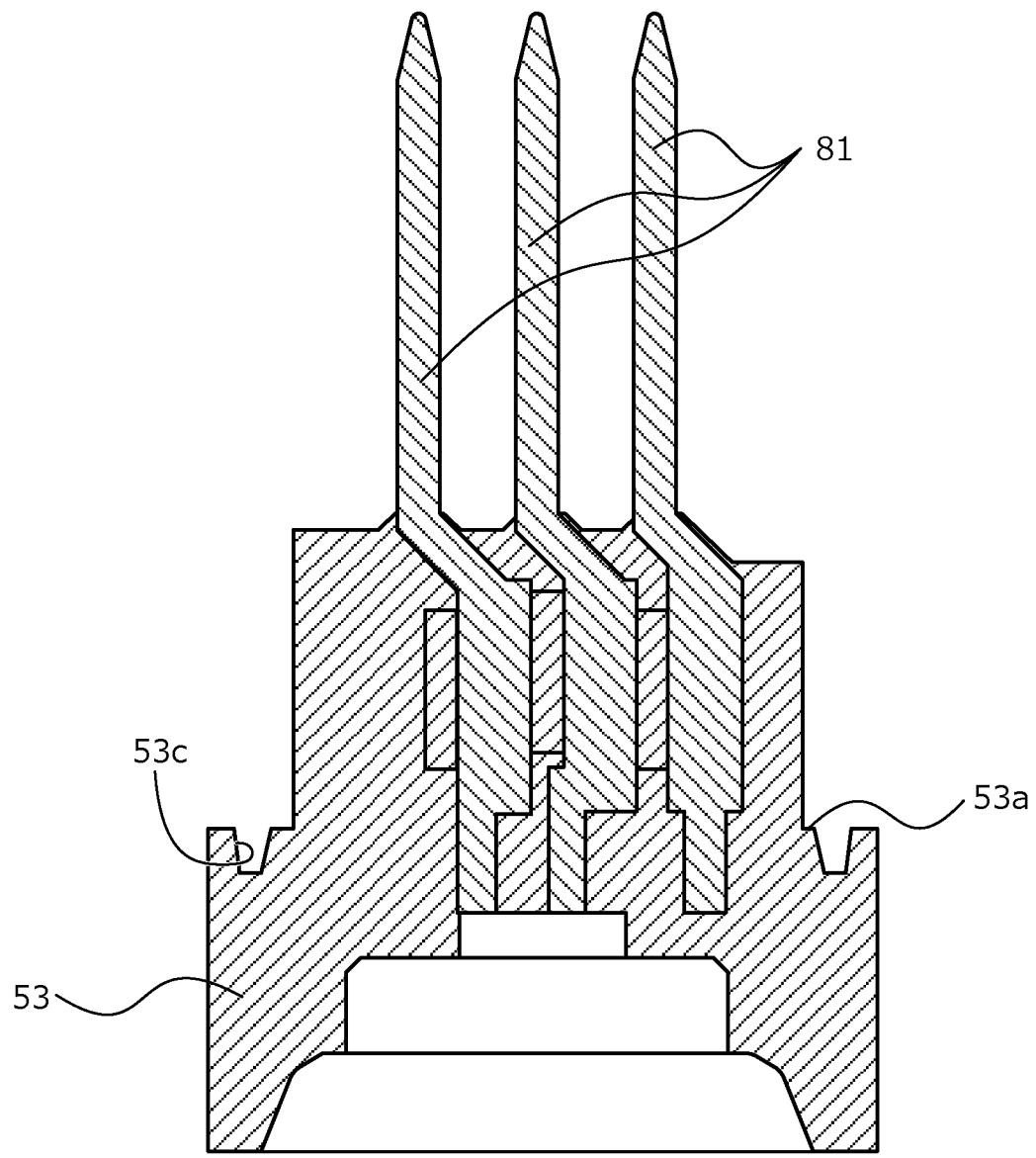
FIG. 7 is a diagram depicting a state of the physical quantity sensor device in FIG. 5 during manufacture (assembly).
Figure 8A:
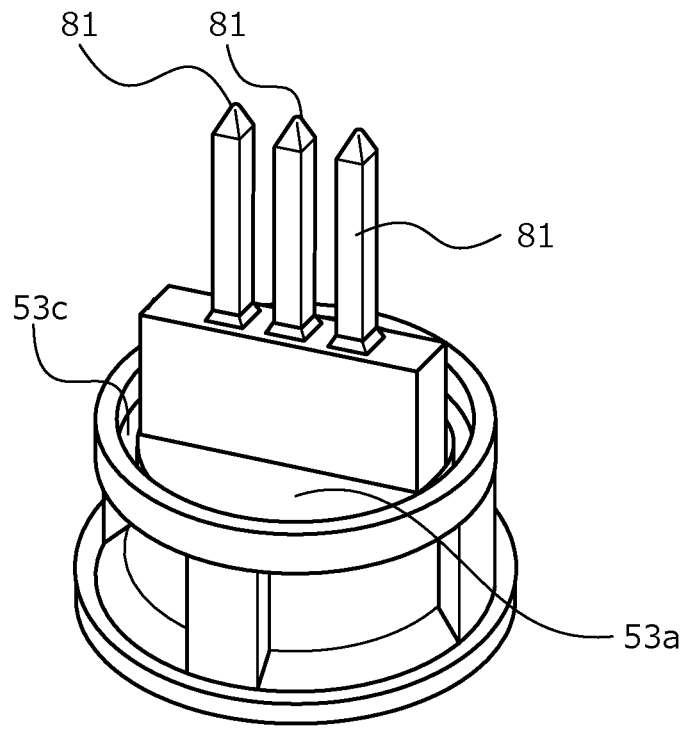
FIG. 8A is a diagram depicting a state of the physical quantity sensor device in FIG. 5 during manufacture (assembly).
Figure 8B:
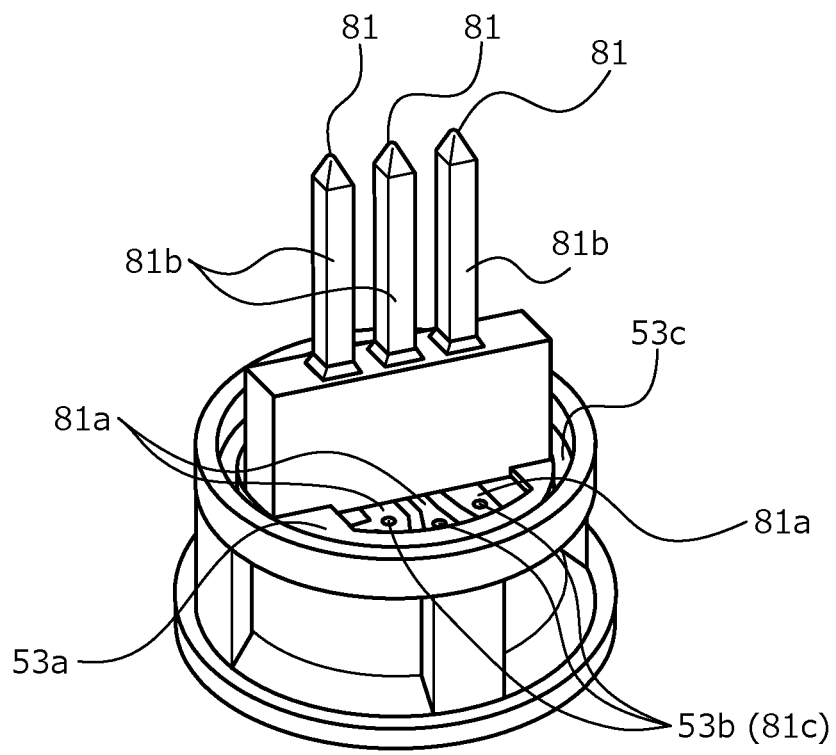
FIG. 8B is a diagram depicting a state of the physical quantity sensor device in FIG. 5 during manufacture (assembly).

The horizontal portions 81a of the connector pins 81 are embedded in the upper portion 53a of the inner housing portion 53. The through-holes 81c for the horizontal portions 81a of the connector pins 81 and a periphery of the through-holes 81c are exposed from the upper portion 53a of the inner housing portion 53. The vertical portions 81b of the connector pins 81 protrude upward from the upper portion 53a of the inner housing portion 53 and are exposed. FIG. 7 depicts a cross-sectional view and FIGS. 8A and 8B depict external views of the inner housing portion 53 in which the connector pins 81 are integrated. In the inner housing portion 53, a recess 53c is provided that engages with a joint surface where the socket housing portion 54 is joined (FIGS. 7, 8A, 8B).

Each of the through-holes 53b of the upper portion 53a of the inner housing portion 53 (FIG. 8B) has a central axis that is a same as a central axis of one of the through-holes 81c for the connector pins 81 (refer to FIGS. 6A, 6B, 6C), and is continuous with the one of the through-holes 81c for the connector pins 81, thereby forming a single through-hole. Therefore, the through-holes 53b of a front surface of the inner housing portion 53 viewed from the socket housing portion 54 are integrated with the through-holes 81c for the connector pins 81. As depicted in later-described FIGS. 15A and 15B, the through-holes 53b of a back surface of the inner housing portion 53 viewed from the storage box 60 are through-holes formed in resin and correspond to the through-hole 12 of the resin guide portion 11 in FIG. 1.

Figure 9:
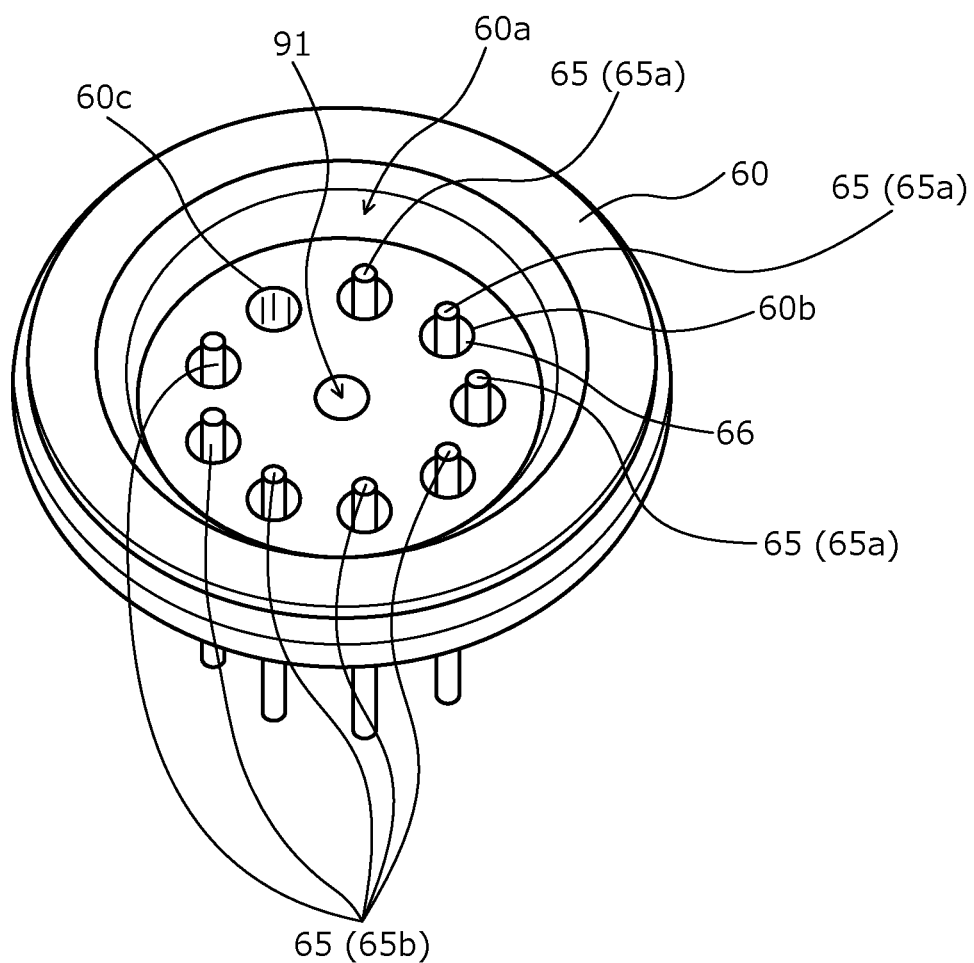
FIG. 9 is a diagram depicting a state of the physical quantity sensor device in FIG. 5 during manufacture (assembly).

Next, processes from attachment of the lead pins 65 to injection/sealing of the pressure medium are described with reference to FIGS. 9 to 14. Here, an instance in which the through-holes 60b are provided along an outer periphery of the storage box 60 having a substantially round shape in a plan view thereof is described as an example. Of multiple holes of the storage box 60, one of the holes is an injection hole 60c for injecting oil that is the pressure medium, and the remaining holes are the through-holes 60b through which the lead pins 65 penetrate. As depicted in FIG. 9, after the lead pins 65 are respectively passed through the through-holes 60b of the storage box 60, the insulating members 66 such as glass is poured into the through-holes 60b, whereby the lead pins 65 and the storage box 60 are joined (air-tight sealing).

Figure 10:
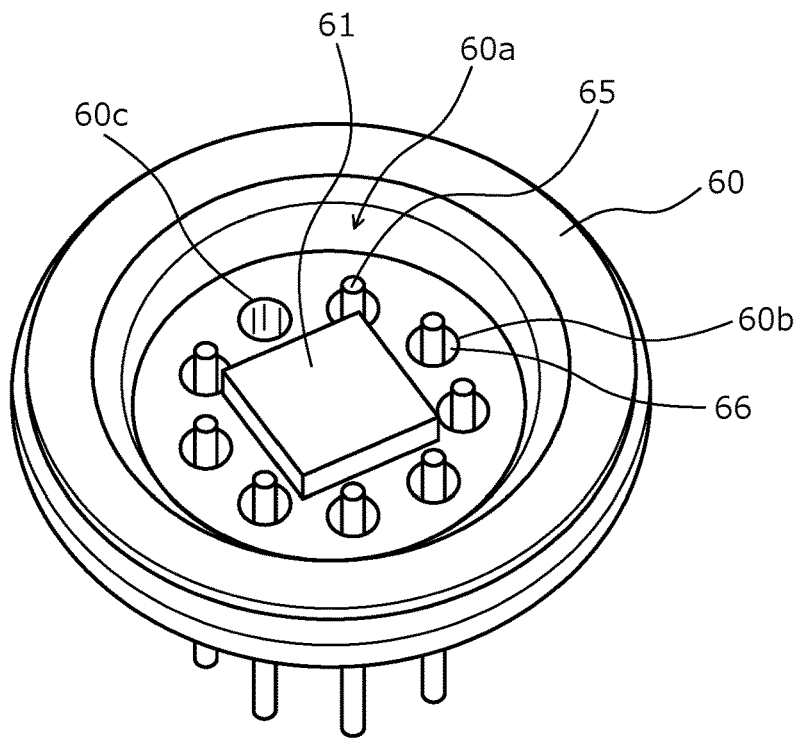
FIG. 10 is a diagram depicting a state of the physical quantity sensor device in FIG. 5 during manufacture (assembly).
Figure 11:
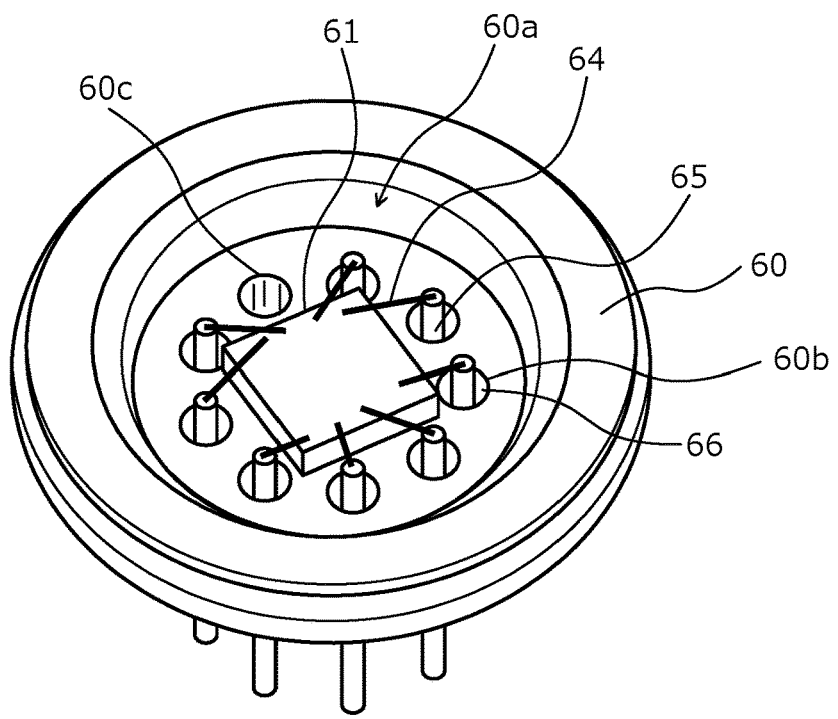
FIG. 11 is a diagram depicting a state of the physical quantity sensor device in FIG. 5 during manufacture (assembly).
Figure 12:
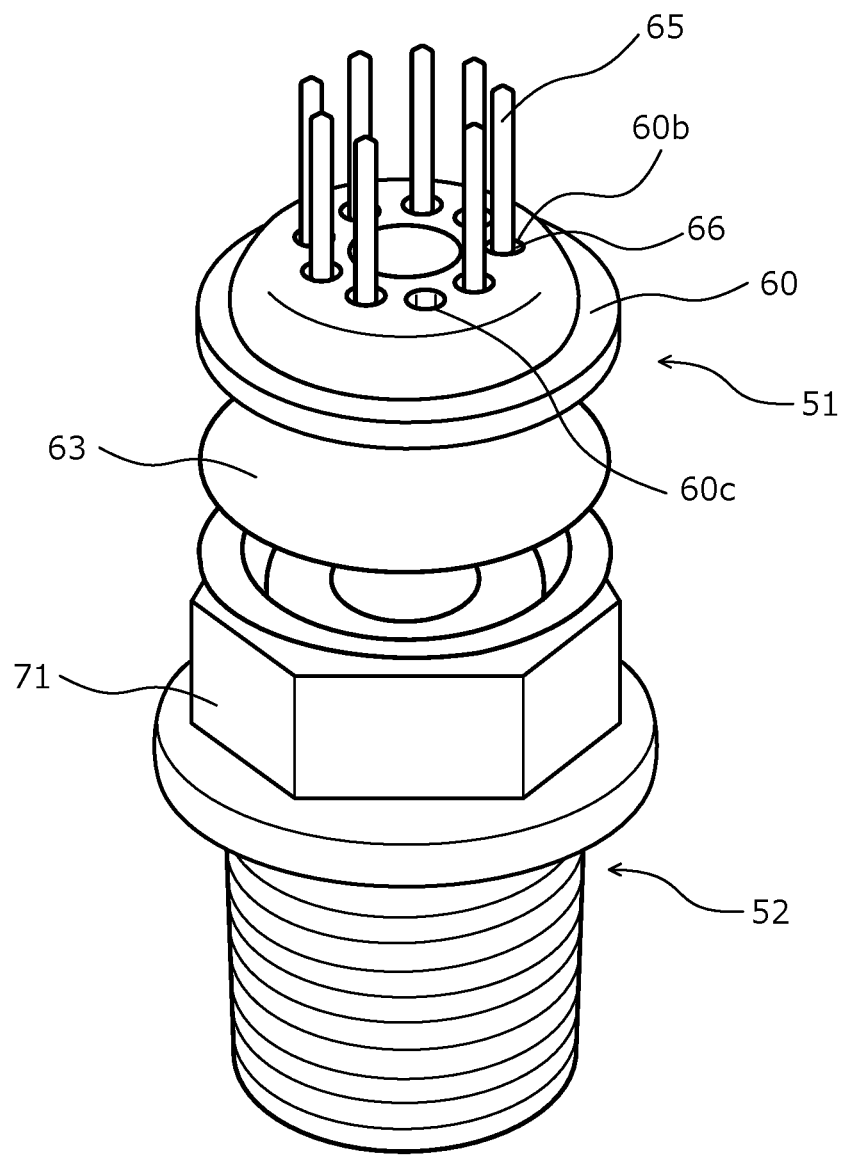
FIG. 12 is a diagram depicting a state of the physical quantity sensor device in FIG. 5 during manufacture (assembly).

Next, an adhesive 91 is applied to the bottom of the recess 60a, at a portion thereof free of the through-holes 60b, for example, a center of the bottom of the recess 60a of the storage box 60. Next, as depicted in FIG. 10, on the adhesive 91 at the bottom of the recess 60a of the storage box 60, the pressure sensor chip 61 is mounted and adhered. Next, as depicted in FIG. 11, the lead pins 65 and the electrodes of the pressure sensor chip 61 are electrically connected by the bonding wires 64. Next, as depicted in FIG. 12, the storage box 60 is placed on the base 71 of the screw portion 52 so that the recess 60a is facing downward (facing toward the screw portion 52) and the diaphragm 63 is between the storage box 60 and the base 71, stacked (overlapping) portions of these members are joined by, for example, laser seam welding.

Figure 13:
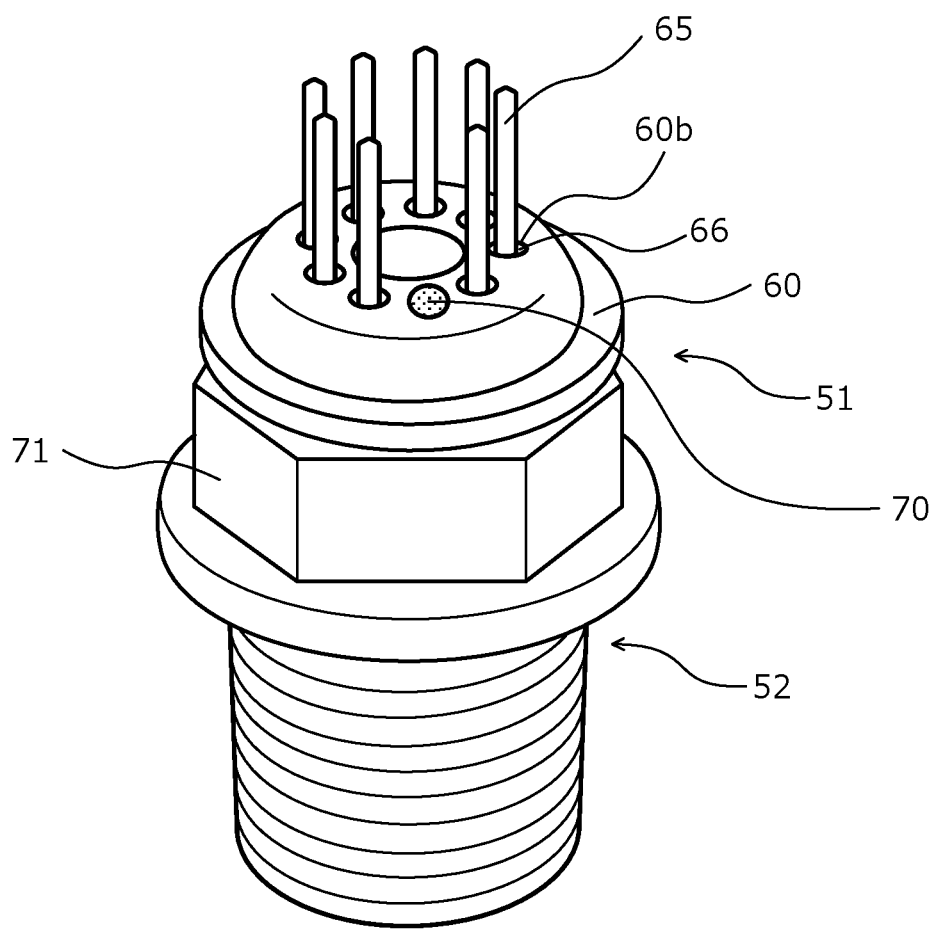
FIG. 13 is a diagram depicting a state of the physical quantity sensor device in FIG. 5 during manufacture (assembly).
Figure 14:
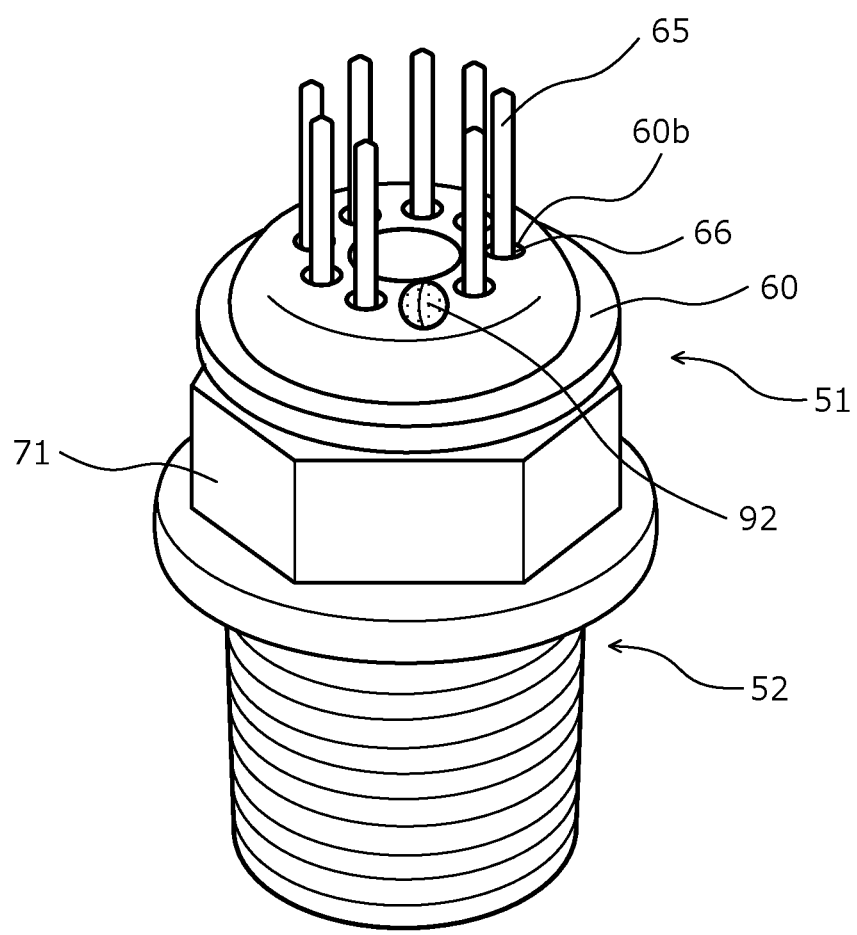
FIG. 14 is a diagram depicting a state of the physical quantity sensor device in FIG. 5 during manufacture (assembly).

Next, as depicted in FIG. 13, under a vacuum atmosphere, a liquid 70 such as a silicone oil is injected from the injection hole 60c of the storage box 60, into a space surrounded by the recess 60a of the storage box 60 and the diaphragm 63. Next, as depicted in FIG. 14, a metal sphere 92 containing a metal such as, for example, SUS is pressed in the injection hole 60c of the storage box 60 and voltage is applied to the metal sphere 92. As a result, the metal sphere 92 is welded (resistance welded) to the opening of the injection hole 60c of the storage box 60, thereby sealing the liquid 70 in the space surrounded by the recess 60a of the storage box 60 and the diaphragm 63. Next, by a general method, trimming and adjustment of characteristics of the sensor element 51 are performed.

Figure 15A:
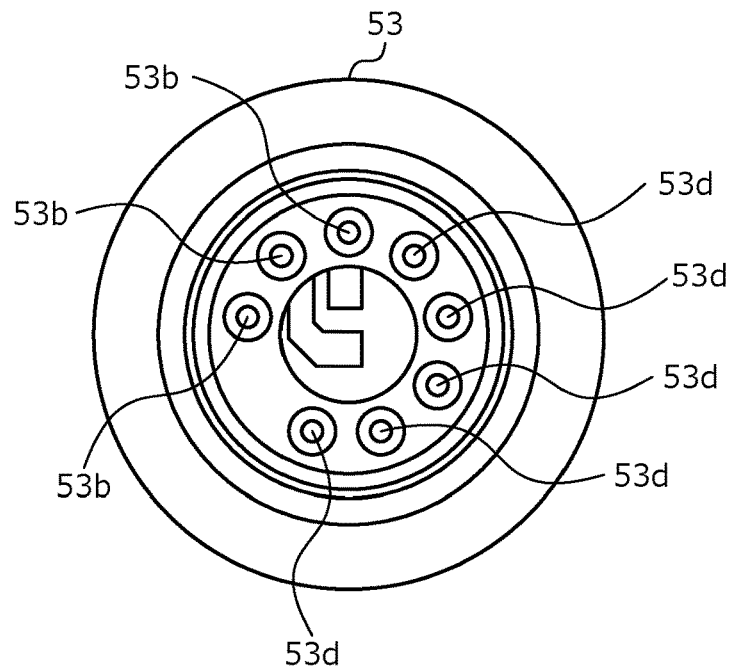
FIG. 15A is a diagram depicting a state of the physical quantity sensor device in FIG. 5 during manufacture (assembly).
Figure 15B:
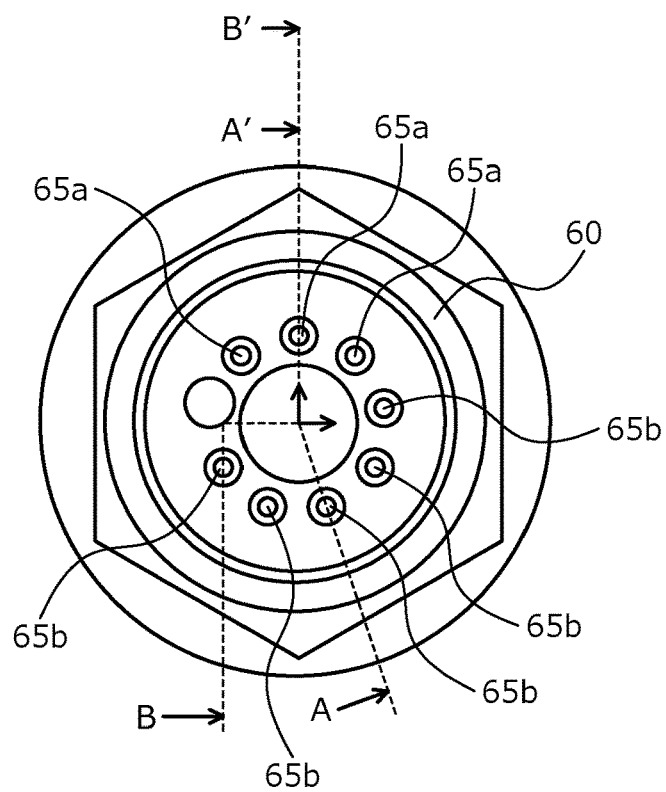
FIG. 15B is a diagram depicting a state of the physical quantity sensor device in FIG. 5 during manufacture (assembly).

Next, a process of adhering the inner housing portion 53 and the storage box 60 is described using FIGS. 15A, 15B, 16, and 17. FIG. 15A depicts a state as viewed from a lower surface of the upper portion 53a of the inner housing portion 53 in which the connector pins 81 are integrated, the lower surface being opposite to an upper surface (surface where the connector pins 81 are exposed) of the upper portion 53a. FIG. 15B depicts a state when the storage box 60 welded on the base 71 of the screw portion 52 is viewed from above the storage box 60 (from the surface where the lead pins 65 are exposed). As depicted in FIGS. 15A and 15B, the multiple through-holes 53b (here, 3) and multiple grooves 53d (here, 5) are provided in the upper portion 53a of the inner housing portion 53.

Figure 16:
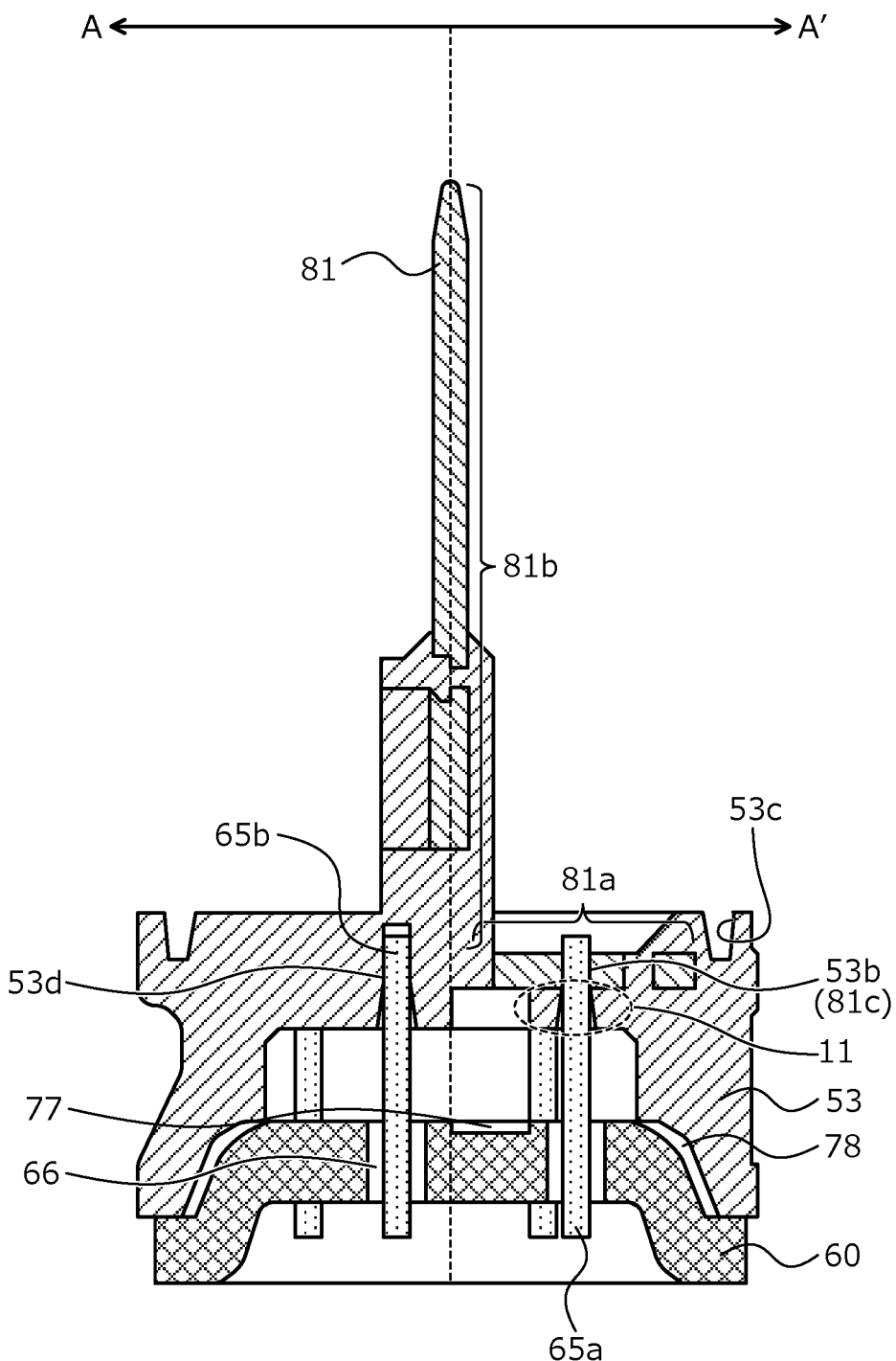
FIG. 16 is a diagram depicting a state of the physical quantity sensor device in FIG. 5 during manufacture (assembly).

As depicted in FIG. 16, the adhesive 78 (refer to FIG. 5) is applied to an outer peripheral portion the storage box 60, on the side of the storage box 60, opposite to the side of the storage box 60 having the recess 60a, and the inner housing portion 53 is adhered on the storage box 60 via the adhesive 78. At this time, the first lead pins 65a are inserted in the through-holes 53b of the upper portion 53a of the inner housing portion 53, from the lower surface, and penetrate through the through-holes 81c for the connector pins 81 via the through-holes 53b of the upper portion 53a of the inner housing portion 53. The first lead pins 65a are in contact with the connector pins 81, at the through-holes 81c for the connector pins 81 exposed at the upper surface of the upper portion 53a of the inner housing portion 53.

Further, the second lead pins 65b are fitted into the grooves 53d of the inner housing portion 53 and positions of the second lead pins 65b in the vertical direction of the inner housing portion 53 are fixed. For example, in an instance in which the adhesive 78 used is a thermosetting type, until the adhesive 78 is cured, the inner housing portion 53 and the storage box 60 that are adhered to each other via the adhesive 78 may be left in a high temperature state. At this time, the second lead pins 65b may be fitted in the grooves 53d of the upper portion 53a of the inner housing portion 53, whereby lifting of the inner housing portion 53 during the thermosetting of the adhesive 78 may be prevented and therefore, the inner housing portion 53 and the storage box 60 need not be held down.

Further, sidewalls of the through-holes 53b of the upper portion 53a of the inner housing portion 53 (correspond to the sidewall of the second portion 12b of the through-hole 12 of the resin guide portion 11 in FIG. 1) are inclined at a same predetermined angle (corresponds to reference character θ2 in FIG. 1) as sidewalls of the through-holes 81c for the connector pins 81 (correspond to the sidewall of the first portion 2a of the through-hole 2 of the plate-shaped terminal 1 in FIG. 1) and are respectively continuous with the sidewalls of the through-holes 81c for the connector pins 81, each forming a single surface therewith; and a border between the through-holes 53b, 81c is free of the step 113 (refer to FIG. 20) of the conventional structure. Therefore, at the borders between the inner housing portion 53 and the connector pins 81, the end corner portions of the first lead pins 65a becoming caught on the connector pins 81 and being shaved off may be prevented.

Figure 17:
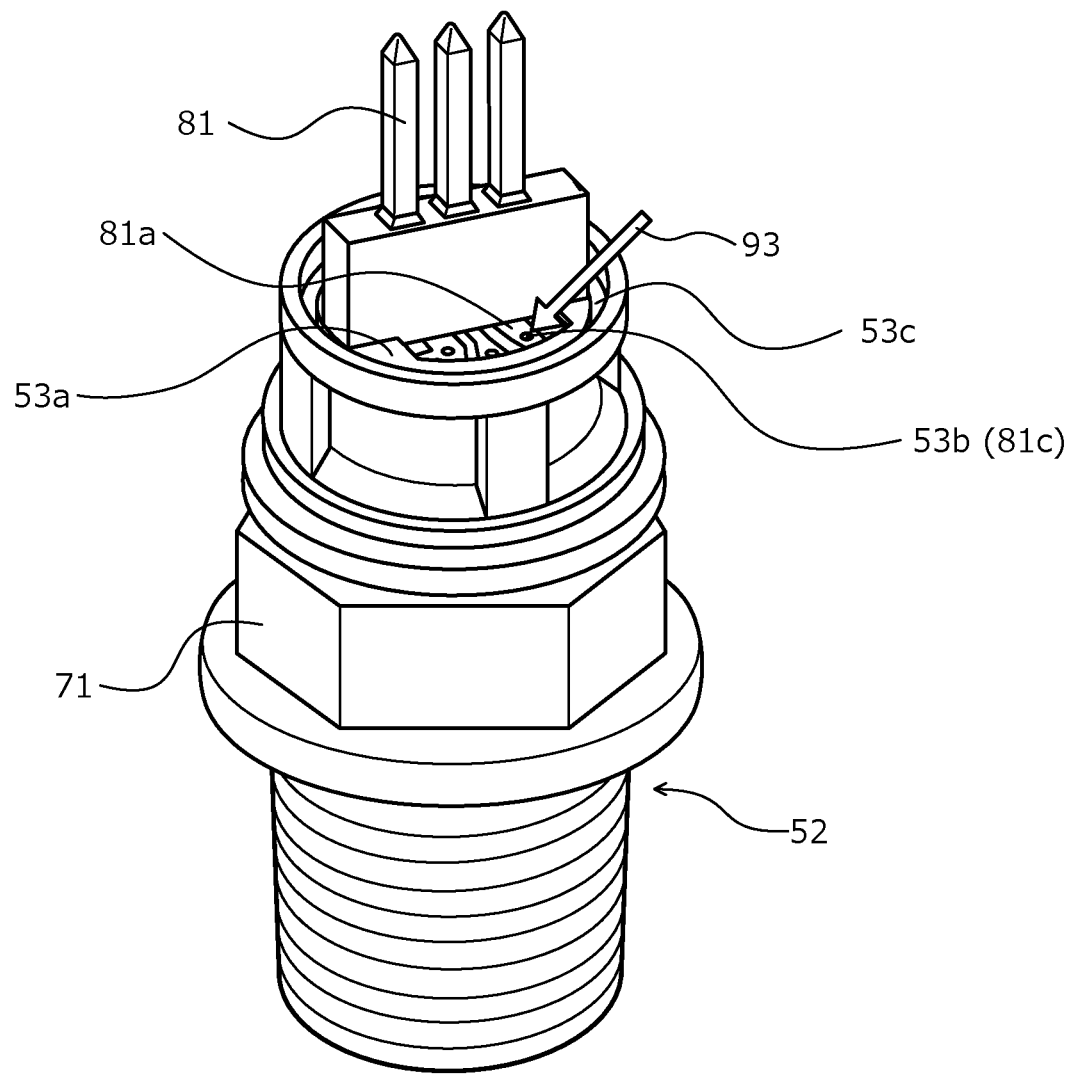
FIG. 17 is a diagram depicting a state of the physical quantity sensor device in FIG. 5 during manufacture (assembly).

At this stage, the socket housing portion 54 covering the periphery of the connector pins 81 is not joined to the inner housing portion 5. FIG. 16 depicts a cross-section of the inner housing portion 53 and the storage box 60 after being adhered to each other. The cross-section is at a position along cutting line A-A' shown in FIG. 15B. In FIG. 16, the screw portion 52, the pressure sensor chip 61, etc. are not depicted. Next, as depicted in FIG. 17, the through-holes 53b of the inner housing portion 53 are irradiated with laser light 93 from above, at a predetermined incident angle, whereby contact portions between the upper ends of the first lead pins 65a and the horizontal portions 81a of the connector pins 81 are welded (joined).

Figure 18A:
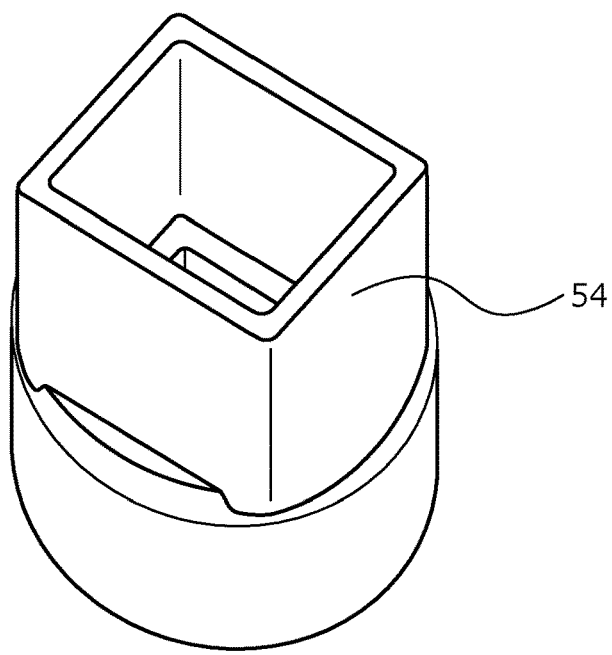
FIG. 18A is a diagram depicting a state of the physical quantity sensor device in FIG. 5 during manufacture (assembly).
Figure 18B:
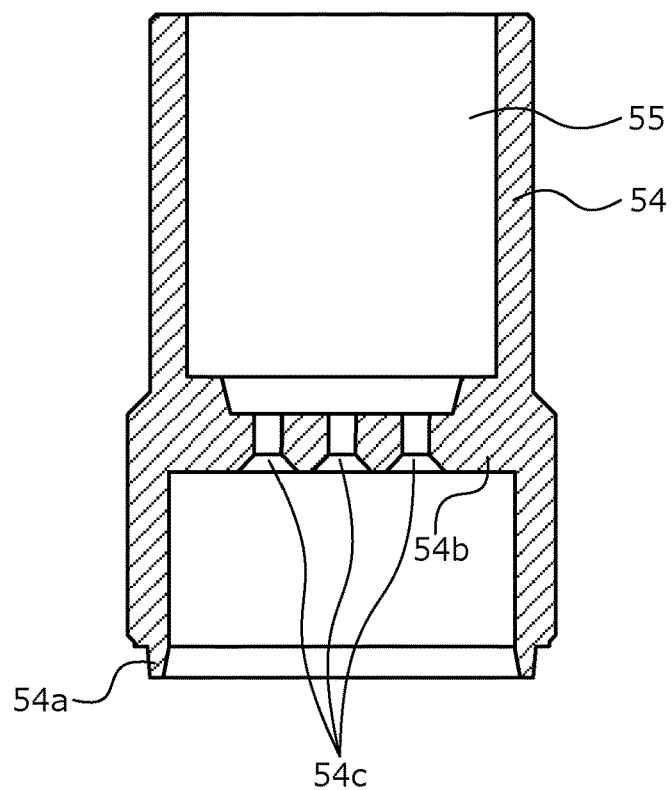
FIG. 18B is a diagram depicting a state of the physical quantity sensor device in FIG. 5 during manufacture (assembly).

Next, the socket housing portion 54 is described with reference to FIGS. 18A and 18B. FIGS. 18A and 18B are a perspective view and a cross-sectional view of the socket housing portion 54, respectively. The socket housing portion 54, at a surface thereof joined to the inner housing portion 53, has a protrusion 54a that is fitted into the recess 53c of the inner housing portion 53; and the vertical portions 81b of the connector pins 81 are housed in an interior of the socket housing portion 54 joined to the inner housing portion 53. The interior of the socket housing portion 54 is a recess and at the bottom 54b of the recess, the through-holes 54c are provided. The different connector pins 81 respectively penetrate through the through-holes 54c of the socket housing portion 54.

Figure 19:
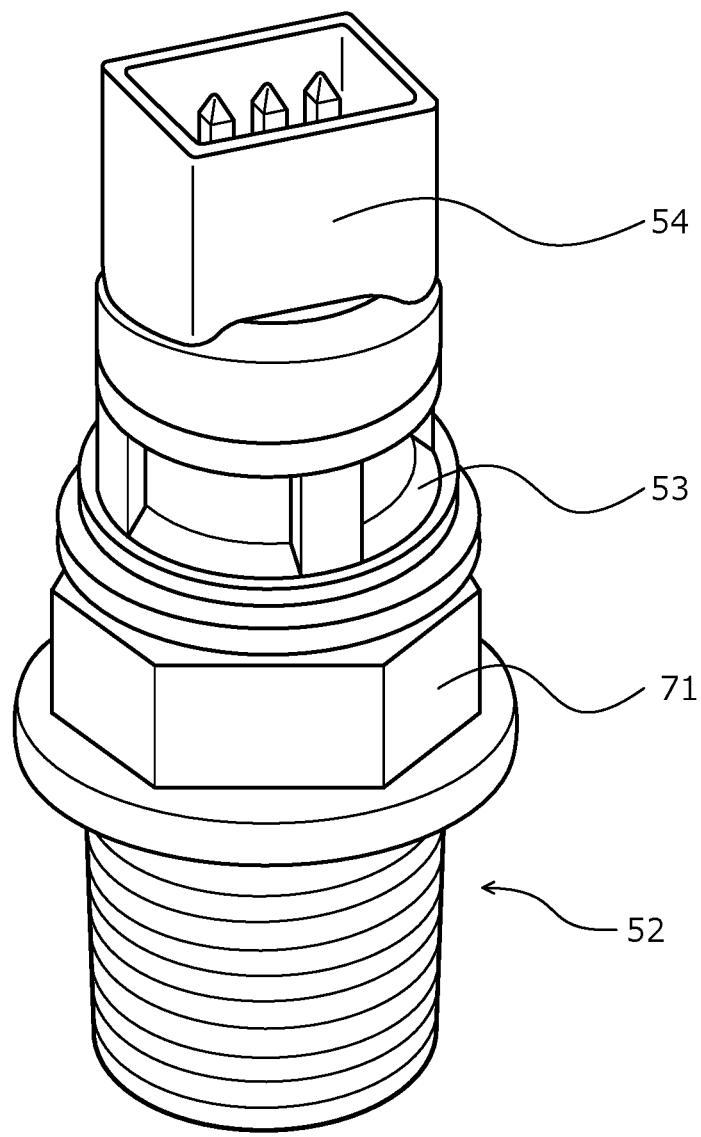
FIG. 19 is a diagram depicting a state of the physical quantity sensor device in FIG. 5 during manufacture (assembly).

Next, a process of joining the socket housing portion 54 and the inner housing portion 53 is described with reference to FIG. 19. As depicted in FIG. 19, the socket housing portion 54 and the inner housing portion 53 are joined by an adhesive. As a result, the socket housing portion 54 is joined to the upper surface of the upper portion 53a of the inner housing portion 53 so as to surround a periphery of the connector pins 81. At this time, the different connector pins 81 respectively penetrate through the through-holes 54c of the socket housing portion 54. Thereafter, the O-ring 76 (FIG. 5) is installed at the lower surface of the base 71 of the screw portion 52, whereby the physical quantity sensor device 50 depicted in FIG. 5 is completed.

Figure 20:
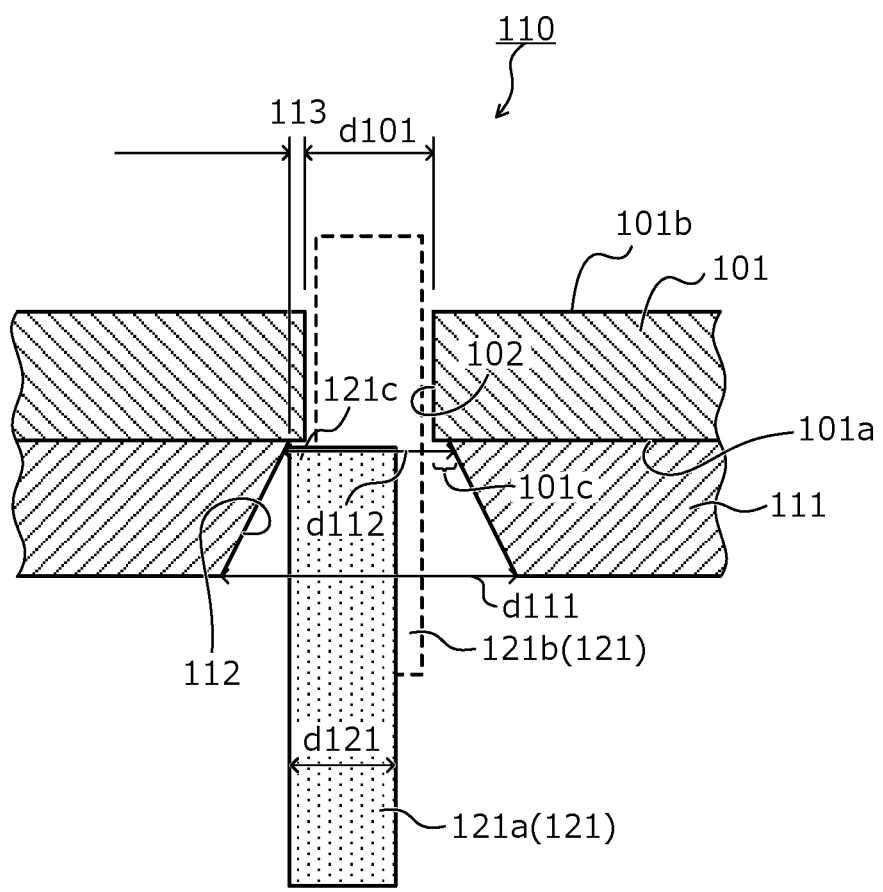
FIG. 20 is a cross-sectional view of a state of a conventional semiconductor package during manufacture (assembly).

As described above, according to the embodiment, the sidewalls of the through-holes of the plate-shaped terminal have a same slope as the sidewalls of the through-holes of the resin guide portion adhered to one surface of the plate-shaped terminal and are respectively continuous with the sidewalls of the through-holes of the resin guide portion, each forming a single surface therewith; and the border between the through-holes of the resin guide portion and the through-holes of the plate-shaped terminal is free of a step like the step of the conventional structure (refer to FIG. 20, corresponds to reference numeral 113). Therefore, without becoming caught on the plate-shaped terminal at the border between the resin guide portion and the plate-shaped terminal, the terminal pins inserted in the through-holes of the resin guide portion may be moved smoothly from the sidewalls of the through-holes of the resin guide portion, to the sidewalls of the through-holes of the plate-shaped terminal to be inserted in the through-holes of the plate-shaped terminal.

As a result, when the terminal pins are inserted in the through-holes of the plate-shaped terminal, metal shavings resulting from the end corner portions of the terminal pins being shaved off by the plate-shaped terminal are not generated and metal burrs at the ends of the terminal pins do not occur, whereby short-circuit defects, etc. due to these metal shavings and metal burrs may be prevented. As a result, product (semiconductor package) quality may be enhanced. Further, according to the embodiment, at the same surface (side surface of the protruding portion of the lower mold) of the mold for forming the housing portion, the sidewalls of the through-holes of the plate-shaped terminal and the sidewalls of the through-holes of the resin guide portion adhered to one surface of the plate-shaped terminal may be set to be in the same plane of the same slope, thereby facilitating formation of the resin guide portion.

In the foregoing, the present invention is not limited to the embodiments described above and various modifications within a range not departing from the spirit of the invention are possible. For example, the present invention is applicable to semiconductor packages of various types of configurations that include a metal member configured by a plate-shaped terminal having a through-hole that penetrates between both flat surfaces, and a terminal pin that penetrates through the through-hole of the plate-shaped terminal and is welded to the plate-shaped terminal. Further, the shape and exterior of the housing portion of the semiconductor package may be variously modified according to the application of the semiconductor package. The housing portion of the semiconductor package needs not be separated into the socket housing portion and the inner housing portion.

According to the invention described above, the sidewall of the through-hole (first through-hole) of the plate-shaped terminal and the sidewall of the through-hole (second through-hole) of the guide portion adhered to a surface of the plate-shaped terminal have the same slope and form a single continuous surface and the border between the through-hole of the guide portion and the through-hole of the plate-shaped terminal is free of a step (refer to FIG. 20, corresponds to reference numeral 113) like the step of the conventional structure. Therefore, the terminal pin inserted in the through-hole of the guide portion may be moved smoothly from the sidewalls of the through-holes of the guide portion to the sidewalls of the through-holes of the plate-shaped terminal without becoming caught on the plate-shaped terminal at the border between guide portion and the plate-shaped terminal. As a result, when the terminal pin is inserted in the through-hole of the plate-shaped terminal, metal shavings resulting from the end corner portion of the terminal pin being shaved off by the plate-shaped terminal are not generated and metal burrs at the end of the terminal pin do not occur, whereby short-circuit defects, etc. due to these metal shavings and metal burrs may be prevented.

The semiconductor package, the resin molded product, and the method of molding a resin molded product according to the present invention achieve an effect in that quality may be enhanced.

As described above, the semiconductor package, the resin molded product, and the method of molding a resin molded product according to the present invention are useful for semiconductor packages having a plate-shaped terminal, and a terminal pin that penetrates through the through-hole of the plate-shaped terminal and is joined to the plate-shaped terminal, and the semiconductor package, the resin molded product, and the method of molding a resin molded product are particularly suitable for physical sensor devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A resin molded product, comprising:
a plate-shaped terminal having a first surface and a second surface that are flat and opposite to each other, the plate-shaped terminal having a first through-hole passing therethrough a rod-shaped terminal pin, the first through-hole penetrating through the plate-shaped terminal, between the first surface and the second surface; and a guide portion containing a resin material, the guide portion having a first side and a second side opposite to each other and being integrally formed with the plate-shaped terminal on the first surface of the plate-shaped terminal so that the second side of the guide portion contacts the first surface of the plate-shaped terminal, the guide portion having a second through-hole having a common central axis with the first through-hole, the second through-hole penetrating through the guide portion and forming a single continuous hole with the first through-hole, wherein the continuous hole has a first open end and a second open end opposite to each other, the first open end being an open end of the first through-hole located at the second surface of the plate-shaped terminal and the second open end being an open end of the second through-hole located at the first side of the guide portion, the continuous hole having a width that gradually decreases along a direction from the second open end to the first open end, whereby the hole has a tapered shape, and a sidewall of the second through-hole and a sidewall of the first through-hole have a same angle with respect to the common central axis, thereby to form a single continuous surface.

2. The resin molded product according to claim 1, wherein an angle of the sidewall of the second through-hole with respect to the common central axis is in a range from 0 degrees to 30 degrees.

3. The resin molded product according to claim 1, wherein the second through-hole has a first portion that is apart from the first through-hole and a second portion that is continuous with the first through-hole, and an angle of the sidewall of the second through-hole with respect to the common central axis is wider at the first portion than at the second portion.

4. The resin molded product according to claim 1, wherein the first through-hole has a first portion that is continuous with the second through-hole and a second portion that is apart from the second through-hole, the second portion having a uniform width in an axial direction, and a width of the first through-hole is narrower at the second portion than at the first portion.

5. A semiconductor package, comprising:
the resin molded product according to claim 1;
a semiconductor chip having an electrode;
a housing unit containing a resin material, the housing unit being integrally formed with the plate-shaped terminal and housing the semiconductor chip, whereby the guide portion is a portion of the housing unit; and
the terminal pin that penetrates through the second through-hole and the first through-hole, and is exposed outside of the resin molded product at the second surface of the plate-shaped terminal, the terminal pin having a first end and a second end opposite to each other, the first end being joined to the plate-shaped terminal at the second surface thereof, the second end being electrically connected to the electrode of the semiconductor chip.

6. The semiconductor package according to claim 5, wherein the terminal pin is in contact with the sidewall of the first through-hole of the plate-shaped terminal, at a portion of the sidewall of the first through-hole that is apart from the guide portion.

\* \* \* \* \*